US008732560B2

(12) United States Patent
Kern et al.

(10) Patent No.: US 8,732,560 B2

(45) Date of Patent: May 20, 2014

(54) METHOD AND DEVICE FOR CORRECTION OF TERNARY STORED BINARY DATA

(75) Inventors: Thomas Kern, Munich (DE); Michael Goessei, Mahlow (DE)

(73) Assignee: Infineon Technologies AG, Neubiberg (DE)

( * ) Notice: Subject to any disclaimer, the term of this patent is extended or adjusted under 35 U.S.C. 154(b) by 191 days.

(21) Appl. No.: 13/466,400

(22) Filed: May 8, 2012

(65) Prior Publication Data

US 2013/0305119 A1 Nov. 14, 2013

(51) Int. Cl.
*H03M 13/00* (2006.01)

(52) U.S. Cl.
USPC ........... 714/778; 714/758; 714/763; 714/752; 714/785

(58) Field of Classification Search
None
See application file for complete search history.

(56) References Cited

U.S. PATENT DOCUMENTS 7,725,779 B2 * 5/2010 Lablans ........................ 714/701
2006/0020873 A1 * 1/2006 Deolalikar .................... 714/777
2012/0290778 A1 * 11/2012 Elfadel et al. ................ 711/103
2013/0232393 A1 * 9/2013 Przybylski .................... 714/773

* cited by examiner

*Primary Examiner* — John Trimmings
(74) *Attorney, Agent, or Firm* — Eschweiler & Associates, LLC

(57) ABSTRACT

The invention relates to a device and a method for storing binary data in a storage device, in which the binary data is transformed to and stored as ternary data. The storage device uses memory cells capable of storing three states. The device and method furthermore are configured to identify and correct falsified ternary data when reading and outputting the data from storage device.

21 Claims, 8 Drawing Sheets u
k
47
Cod G
41
n
48
x
413
a
Schspei
42
49
x'
Syndr H
45
410
s
43 Korrektor
Dec
46
411
x'
e
44
412
$x^c = x' \oplus e$ x'=x'1, ..., x'n
34
38
Korrektor
Syndr
H
31
35
s=s1, ..., sq
q=n-k
Dec
32
36
e=e1, ..., en
33
37
xc=x'+e u
k
47
Cod
G
41
n
48
x
413
a
Schspei
42
49
x'
Syndr
H
45
410
s
43
Korrektor
Dec
46
411
x'
e
44
412
$x^c = x' \oplus e$

METHOD AND DEVICE FOR CORRECTION OF TERNARY STORED BINARY DATA

FIELD

The invention relates to a method and device for storing data, particularly for storing binary data in a memory using ternary storage. A method and corresponding circuitry are provided allowing the correction of stored binary data.

BACKGROUND

Data processing systems of today operate on data represented to any processing device in a binary format. Storage of these data takes place in a memory device typically using binary storage systems comprising storage cells. Typically each storage cell stores one bit, i.e. the storage cell is capable of storing two distinguishable states representing the states of the bit, i.e. either one or zero. A stream of binary data that is to be stored can be passed to a storage device for storing. The storage device is adapted and configured to set the memory cells corresponding to the input data stream when receiving the data for storing and to read the data from the memory cells upon request.

However the data read out from a memory can differ from the original data, i.e. the data that were provided for storing for variable reasons. In one example a storage cell may be faulty.

Numerous algorithms and corresponding solutions for identifying and correcting bit errors in stored data are known to prevent any falsification of data when reading stored data from binary memory cells.

Modern memory devices may use ternary memory or storage cells, i.e. cells adapted and configured for storing data, wherein each cell is adapted and configured to distinguish between three states. These memories may be used in combination with binary processing devices that provide binary data, i.e. wherein the information is represented in bits, each bit representing a binary value. So when storing binary data in a ternary memory device, i.e. a device using ternary storage cells, there must be some arrangement in the memory device not only for converting the binary to ternary data upon storage and for converting ternary to binary data when reading, but also for providing correction means to ensure that the read out data equals the data provided upon storing.

BRIEF DESCRIPTION OF THE FIGURES

The following figures shall illustrate the invention, wherein.

DETAILED DESCRIPTION

The invention will now be described by means of embodiments. Note that the embodiments shall be understood as illustration only but not restricting the invention.

Figure 1:
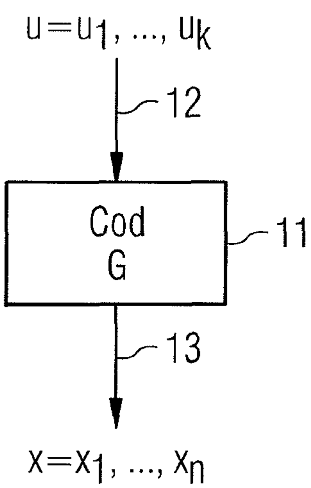
FIG. 1 depicts an encoder.

FIG. 1 illustrates an encoder Cod 11 encoding a binary data sequence $u=u_1, \ldots, u_k$ of k bits, wherein, $k\geq 2$, to an encoded binary data sequence $x=x_1, \ldots, x_n$ of n bits with $n>k$ corresponding to a linear code C.

The linear code C may, as is usual, be described by a (k, n) generator matrix G with k rows and n columns, and by a (n−k, n) parity check matrix H, also referred to as H-matrix. The encoded binary data sequence x is determined from the binary data sequence u by $$x=(x_1, \ldots, x_n)=(u_1, \ldots, u_k)\cdot G=u\neq G \quad (1)$$

The k-bit data sequence $u=u_1, \ldots, u_k$ is available at the k-bit input line 12 of the encoder Cod 11, and the data sequence $x=x_1, \ldots, x_n$ determined according to equation (1) is output on the n-bit output line 13.

Figure 2:
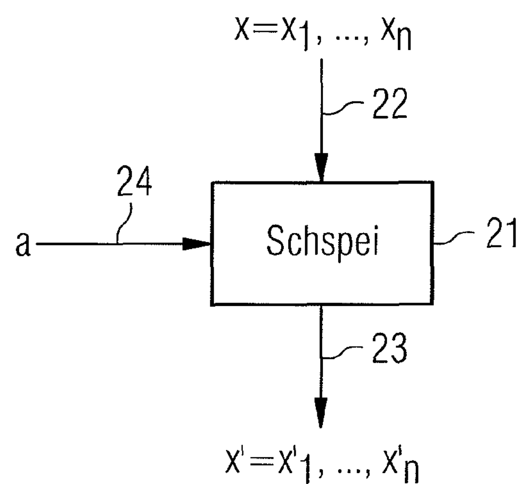
FIG. 2 depicts a circuit arrangement for storing data sequences.

FIG. 2 illustrates a block diagram of a circuit arrangement Schspei 21 for storing data sequences. The circuit arrangement Schspei 21 comprises a data input 22 of at least n bits for the input of a binary data sequence $x=x_1, \ldots, x_n$ of word size n, an address input 24 for the input of a binary address $a=a_1, \ldots, a_l$ with l address bits, wherein $l\geq 2$, and a data output 23 of at least n bits for the output of an n-bit binary data sequence $x'=x'_1, \ldots, x'_n$. The data sequence x is encoded by using a code C. Additional control signals such as, for instance, the read signal and the write signal that are common for memory circuits and are known to a person skilled in the art are not illustrated in FIG. 2.

The circuit arrangement Schspei 21 is configured such that it is possible to write a binary data sequence x under an address a, to store corresponding values, and to read out a binary data sequence at a later point in time, for instance, also under the address a. The binary data available at the inputs are transformed to analog values in the circuit arrangement Schspei and stored as analog values, for example voltages or electric charges, in memory cells. These analog values may, depending on the belonging of the analog value to three different intervals, be interpreted as ternary values, as is, for instance, proposed in P. J. Krick, THREE-STATE MNOS FET MEMORY ARRAY, IBM technical disclosure bulletin, vol. 18, 12, 1976, pp. 4192-4193. The stored values may be designated as analog values in general and, if one intends to emphasize their belonging to the three intervals considered, also as ternary values. The value stored in a memory cell is also referred to as the condition of the memory cell.

On reading out, the ternary values stored are re-transformed to binary values and read out as binary values, so that the circuit arrangement Schspei 21 behaves in its external behavior like a binary memory, although the values are internally stored as ternary values.

When data is stored in the circuit arrangement Schspei, it is possible that these data are modified incorrectly, so that a binary data sequence $x=x_1, \ldots, x_n$ written under the address a, and which is stored in a ternary manner in the circuit arrangement, differs from a binary data sequence $x'=x'_1, \ldots, x'_n$ read out under the same address after a certain time. So if $x=x'$ applies, no error has occurred, but if $x\neq x'$ applies, then an error has occurred. If a stored ternary value changes due to an error, this error in a ternary value may have the effect that one bit or several bits in a read-out binary data sequence change. A single error in a ternary, stored value may result in a multi bit error in the binary data sequence.

So far, no circuit arrangement and no method for error correction are known which enable one to correct those single bit and multi bit errors in the read-out binary data sequences that occur due to single errors in the ternary stored values.

In one embodiment, the present invention serves to correct single bit and multi bit errors in the read-out binary data sequences that occur due to single errors in the stored ternary data.

If an error occurs in the stored data, the read-out binary data sequence x' differs from the corresponding written binary data sequence x. Usually, the bit-wise difference of x and x' is designated as an error vector e that is determined as $$e=e_1, \ldots, e_n=x_1\oplus x'_1, \ldots, x_n\oplus x'_n=x\oplus x'$$

wherein $\oplus$ designates the addition modulo 2 (or the logic function antivalence or XOR). For the components $e_i$ of the error vector e there applies that $e_i=1$ if $x_i\neq x'_i$. Similarly we have $e_i=0$ if $x_i=x'_i$.

Figure 3:
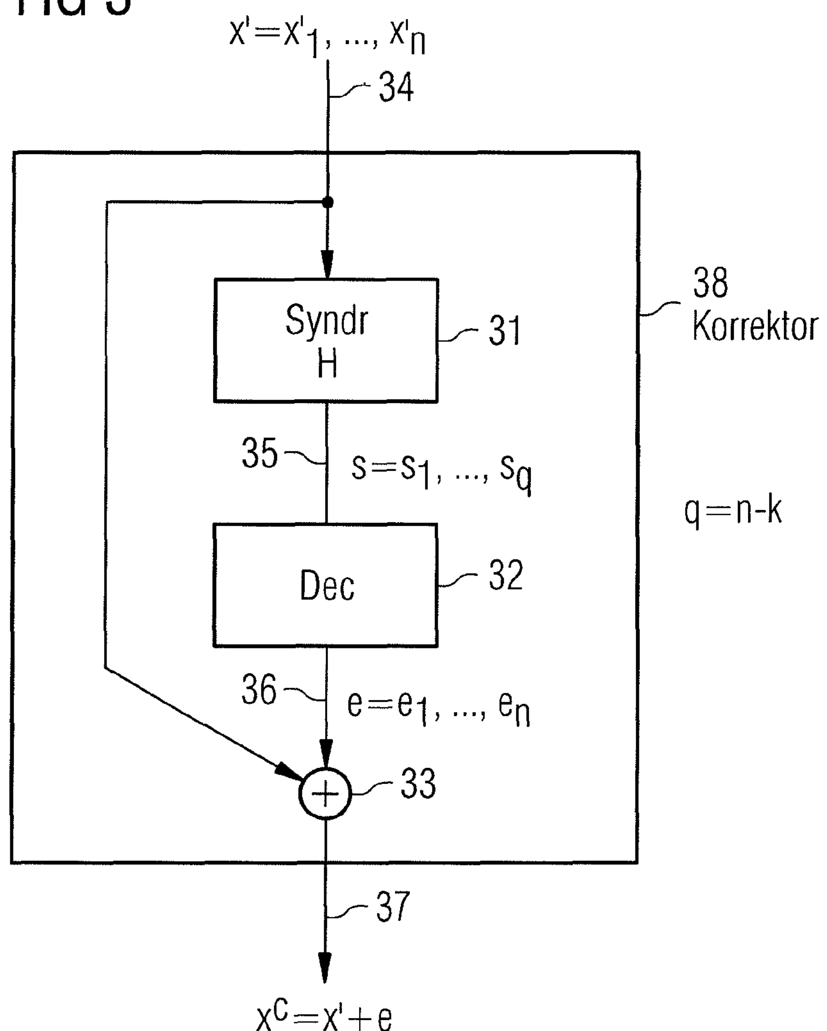
FIG. 3 depicts circuitry for correcting an error.

FIG. 3 illustrates a circuit arrangement for error correction, referred to as corrector 38. The corrector 38 includes a syndrome generator Syndr 31, a decoder Dec 32, and an XOR circuit 33.

The syndrome generator Syndr 31 is configured to generate from the binary sequence $x'=x'_1, \ldots, x'_n$ a q-component error syndrome $s=s_1, \ldots, s_q$ with q=n−k according to the relation $$s^T=(s_1, \ldots, s_q)^T=H\cdot(x'_1, \ldots, x'_n)^T=H\cdot x'^T \quad (2)$$

H is the H-matrix, i.e. the parity check matrix, (with q rows and n columns) of the code C.

Decoder circuitry DEC 32 is configured to generate an error vector $e=e_1, \ldots, e_n$ for the correction of the possibly incorrect bit sequence x' to the corrected bit sequence $x^c=x^c_1, \ldots, x^c_n$ from the error syndrome $s=s_1 \ldots, s_q$ of the length q, wherein the correction is performed according to the relation $$x^c=x^c_1, \ldots, x^c_n=x'_1\oplus e_1, \ldots, x'_n\oplus e_n=x'\oplus x^c \quad (3)$$

wherein $s^T$ is a q-component column vector with the components $s_1, \ldots, s_q$, and $(x'_1, \ldots, x_n)^T$ is an n-component column vector.

If the error occurred is an error correctable by the used code C, there applies $$x^c=x'\oplus e=x,$$

and the error is corrected properly.

The circuit arrangement for error correction pursuant to FIG. 3 will now be described in more detail.

The line 34 carrying the binary sequence $x'=x'_1, \ldots, x'_n$ is both coupled to the n-bit input of the syndrome generator Syndr 31 and to an n-bit first input of the XOR circuit 33. The q=n−k bit output line 35 of the syndrome generator Syndr 31 which carries the error syndrome $s=s_1, \ldots, s_q$ is coupled to the input of the decoder Dec 32. The n-bit output line 36 of the decoder 32 which carries the n components of the error vector $e=e_1, \ldots, e_n$ is connected in the correct position to the second, n-bit input of the XOR circuit 33 whose n-bit output carries the components $x^c_1, \ldots, x^c_n$ of the binary sequence $x^c$. The XOR circuit 33 is implemented in one embodiment by n parallel 2-input XOR gates with one output each.

Figure 4:
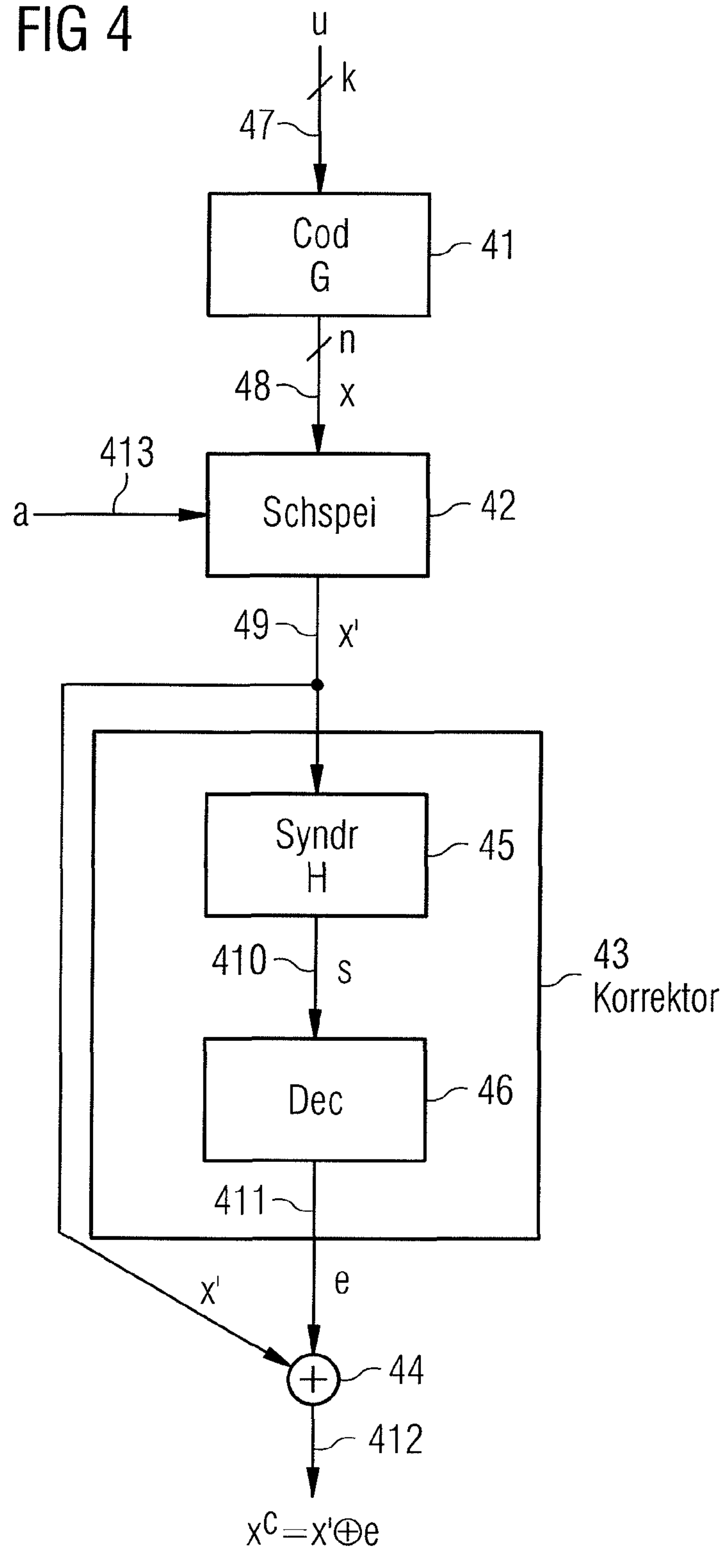
FIG. 4 depicts an arrangement of the circuitry depicted in FIGS. 1-3.

FIG. 4 illustrates how the partial circuits illustrated in FIGS. 1, 2, and 3 may be connected to form a complete circuit enabling correction of storage errors according to one embodiment.

The circuit arrangement of FIG. 4 includes an encoder 41 (11 in FIG. 1), a circuit arrangement Schspei 42 (21 in FIG. 2) for storing data sequences, a corrector 43 (38 in FIG. 3) comprising a series connection of a syndrome generator Syndr 45 (31 in FIG. 3) and a decoder Dec 46 (32 in FIG. 3), and an XOR circuit 44 (33 in FIG. 3).

The k-bit input line 47 carrying the data sequence $u=u_1, \ldots, u_k$ is coupled to the input of the encoder 41. The n-bit output 48 of encoder 41 carries coded data sequence $x=x_1, \ldots, x_n$ and is coupled to the input of the circuit arrangement Schspei 42. The n-bit output 49 of the circuit arrangement Schspei 42 which carries the data sequence $x'=x'_1, \ldots, x'_n$ is coupled to the input of the syndrome generator Syndr 45 and to the first input of the XOR circuit 44. The output 410 of the syndrome generator Syndr 45 which carries the n−k=q bit error syndrome s is coupled to the input of the decoder Dec 46, which in turn is coupled with its output line 411 to the second input of the XOR circuit 44. The n-bit error vector $e=e_1, \ldots, e_n$ is output on output line 411 of the decoder Dec.

The n-bit output 412 of the XOR circuit 44 carries the corrected binary sequence $x^c=x^c_1, \ldots, x^c_n$.

In one embodiment it is provided that only a subset of n' bits of the n bits with n'≤n of the binary sequence x' is corrected. Then, it is only necessary that the decoder Dec 46 provides only a subset of n' components of the error vector e.

Figure 5:
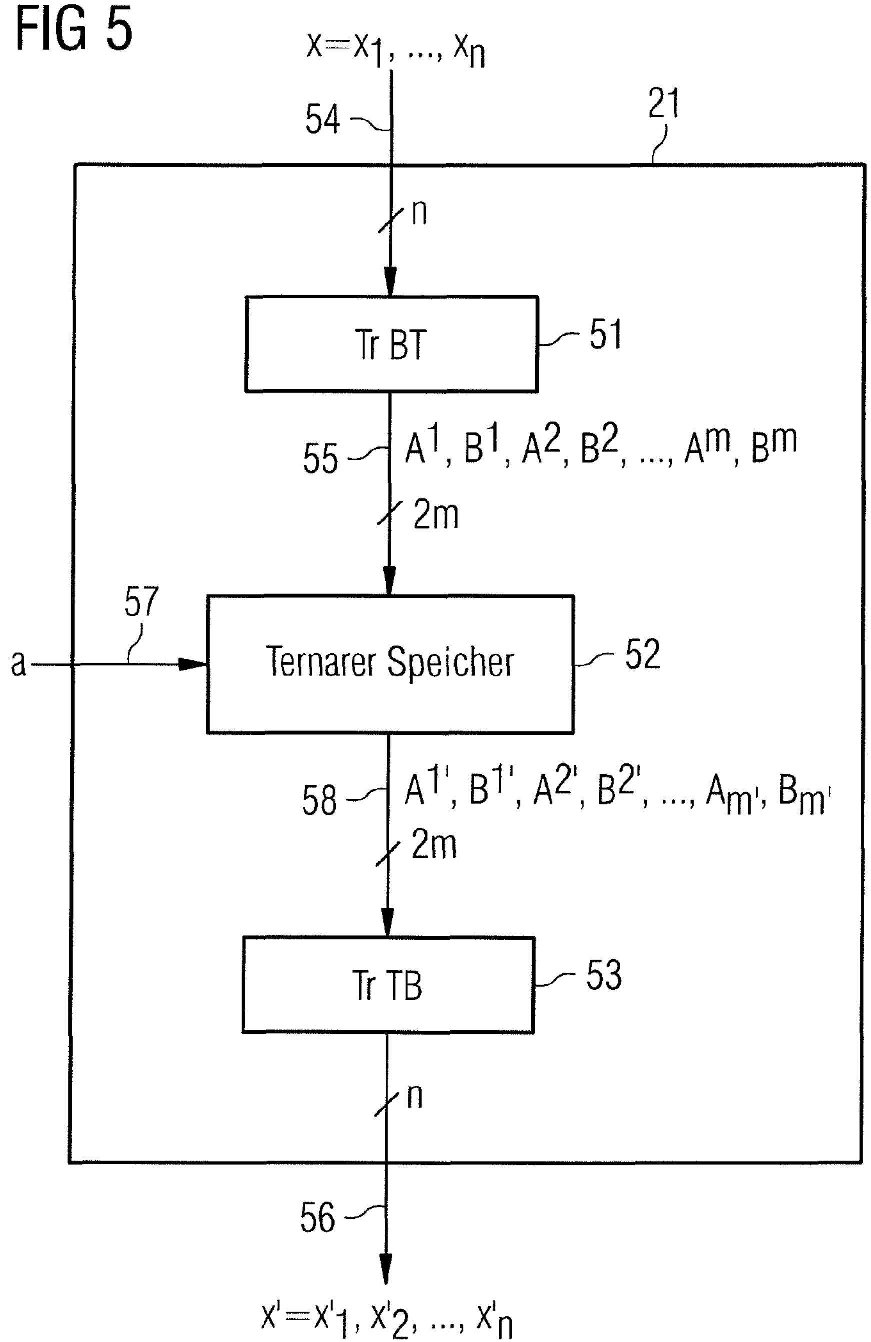
FIG. 5 depicts an embodiment of a circuit arrangement for storing data sequences.

FIG. 5 illustrates an embodiment of a circuit arrangement Schspei 21 for storing data sequences. It comprises a circuit TrBT 51 for transforming binary sequences to analog sequences representing ternary signals, i.e. ternary sequences. Memory 52 is referred to as ternary memory that is adapted and configured to store sequences whose components are analog signals representing ternary signals. Circuit TrTB 53 is adapted and configured to transform analog sequences to binary sequences, wherein the components of the analog sequences represent ternary signals.

Analog signals representing ternary values or conditions are also simply referred to as ternary values or ternary conditions. Correspondingly, the circuits TrBT and TrTB are referred to as a circuit for transforming binary sequences to ternary sequences or signals and as a circuit for transforming ternary sequences to binary sequences or signals.

At the n-bit input line 54 of the circuit TrBT 51, n binary values $x_1, \ldots, x_n$ are provided. These are transformed by circuit 51 to a sequence of 2·m ternary signals $A^1, B^1, \ldots, A^m, B^m$ and are output at the 2·m outputs 55 thereof. These 2-m outputs 55 are coupled to the data inputs of the ternary memory 52 to be stored in this memory under an address a available at the address input 57. If n is divisible by 3 without remainder, then m=n/3. If n is not divisible by 3 without remainder, the binary sequence $x=x_1, \ldots, x_n$ may be supplemented by one further or two further bits which are, for instance, constantly equal to 0, to a binary sequence $x_1, x_2, \ldots, x_{n'}$, with n' components, so that n' is divisible by 3 without remainder. The supplemented bits may, for instance, be chosen to be constantly equal to 0.

If the ternary data stored in the ternary memory 52 are read under the address a that is available on the address line 57 of the ternary memory, the ternary data $A^{1\prime}, B^{1\prime}, \ldots, A^{m\prime}, B^{m\prime}$ are output on the 2·m data outputs 58 of the memory 52. Due to an error, possibly caused by radiation or by a gradual loss of charge or other reasons, the data written in the memory may be erroneous.

If no error exists, there applies $$A^1,B^1, \ldots, A^m,B^m=A^{1\prime},B^{1\prime}, \ldots, A^{m\prime},B^{m\prime}$$

and in the case of an error there applies $$A^1,B^1, \ldots, A^m,B^m\neq A^{1\prime},B^{1\prime}, \ldots, A^{m\prime},B^{m\prime}.$$

The 2m-bit output line 58 of ternary memory 52 is coupled to 2m analog inputs of circuit TrTB 53. Circuit TrTB 53 transforms ternary values $A^{1'}, B^{1'}, \ldots, A^{m'}, B^{m'}$ to binary values $x'_1, \ldots, x'_n$ that are output on the n-bit output 56 of circuit TrTB 53.

Figure 6A:
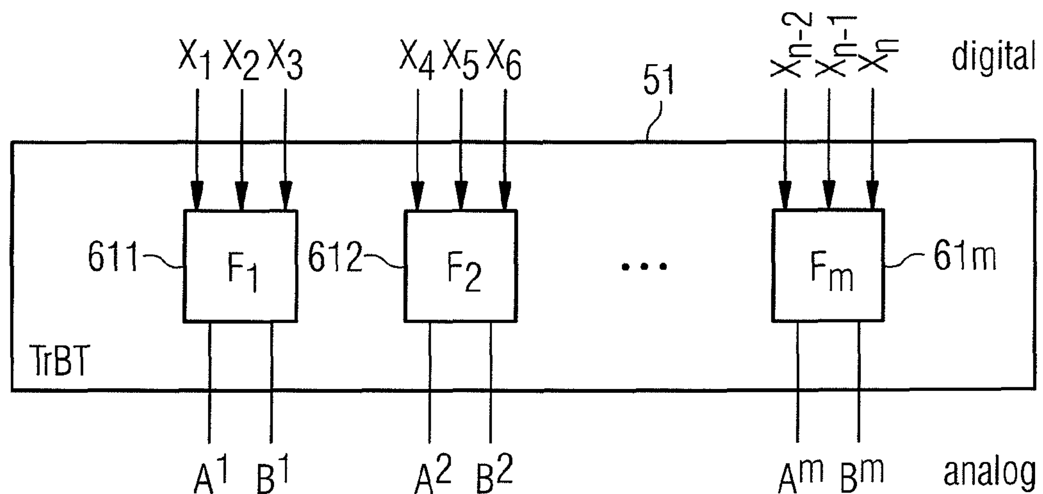
FIGS. 6*a* and 6*b* depict embodiments of circuitry for transforming binary to ternary values.
Figure 6B:
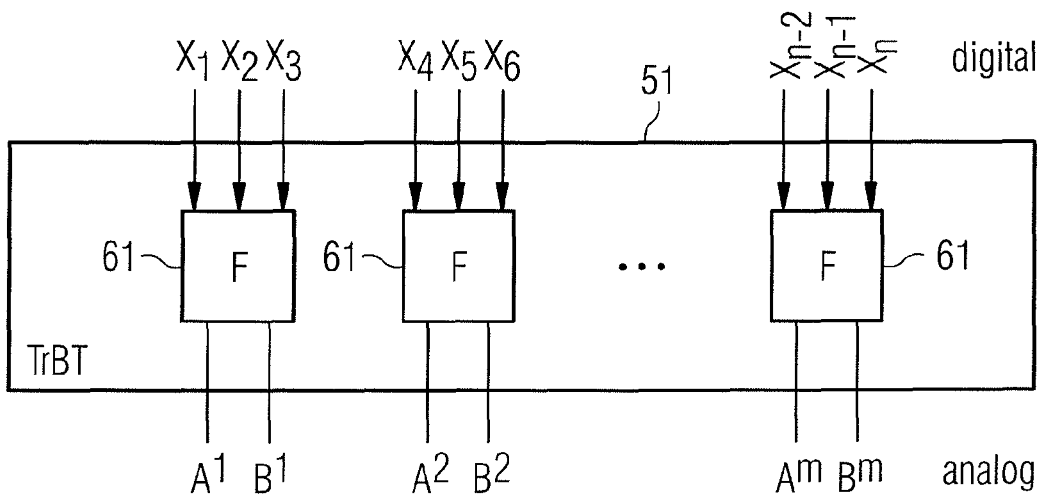

FIG. 6*a* and FIG. 6*b* illustrate embodiments of the circuit TrBT 51 for transforming a binary sequence $x_1, \ldots, x_n$ of length n to a sequence $A^1, B^1, \ldots, A^m, B^m$ of length 2·m of analog data representing ternary values. These ternary values are stored in the memory cells of the ternary memory 52. The analog value representing the ternary value stored in a memory cell is also referred to as the condition of the memory cell. The analog values A and B may be voltage values. In a non-volatile memory this is, for instance, the threshold voltage of the memory cell which is determined by the charging condition on the floating gate. Other physical quantities may, however, also be taken into consideration. In the instant embodiment, A and B are intended to be voltage values.

Depending on the fact in which of three predetermined intervals $W_0, W_1, W_2$ the values A, B are positioned, these analog values are referred to as $A_0, A_1, A_2$ or $B_0, B_1, B_2$, respectively. Thus, if $A \in W_1$ applies for i=0, 1, 2, the analog signal A represents the ternary value $A_1$. If $B \in W_1$ applies for j=0, 1, 2, the analog signal B represents the ternary value $B_j$.

FIG. 6*a* and FIG. 6*b* illustrate how a sequence of binary signals $x_1, \ldots, x_n$ can be transformed to a sequence of ternary signals $A^1, B^1, \ldots, A^m, B^m$.

Circuit TrBT 51 of FIG. 6*a* is composed of partial circuits $F_1$ 611, $F_2$ 612, . . . , $F_m$ 61*m*. These m partial circuits $F_i$, i=1, . . . , m each implement a direct mapping $F_i$ of three-digit binary triples to 2-digit analog values whose components represent a ternary value depending on their belonging to one of the three intervals $W_0, W_1, W_2$. It is not necessary that the three binary values forming a triple of binary values, and which is transformed to a tuple of two ternary values, are directly consecutive in the sequence $x=x_1, \ldots, x_n$. It is, for instance, possible that the binary values $x_1, x_{11}, x_{14}$ form a triple that is transformed to the tuple $A^1, B^1$.

To make the description easily understandable, we assume as an example that the triples of binary data, which are transformed to tuples of ternary data, are each consecutive bits in the sequence x.

In FIG. 6*a* the partial circuit $F_1$ 611 maps the triple $x_1, x_2, x_3$ of binary values to the tuple of the analog values $A^1, B^1$. The partial circuit $F_2$ 612 maps the triple $x_4, x_5, x_6$ of binary values to the tuple of the analog values $A^2, B^2$, and the partial circuit $F_m$ 61*m* maps the triple $x_{n-2}, x_{n-1}, x_n$ of binary values to the tuple of the analog values $A^m, B^m$. The function, which is implemented by partial circuit $F_i$, is designated with $f_i$. In one embodiment all partial circuits $F_1, \ldots, F_m$ may be identical to partial circuit F 61, as is illustrated in FIG. 6*b*, so that there applies $F=F_1= \ldots =F_m$. Then, the partial circuit implements the function $f$.

Circuit TrBT 51 is thus implemented in FIG. 6*b* as a parallel circuit of m identical partial circuits F 61 with three binary inputs and two analog outputs each.

Figure 7A:
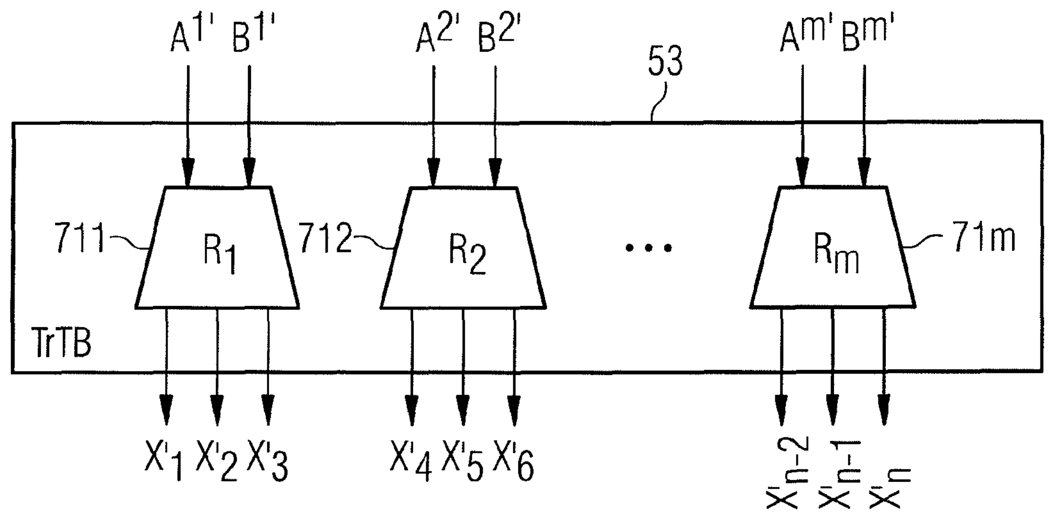
FIGS. 7*a* and 7*b* depict embodiments of circuitry for transforming ternary to binary values.

FIG. 7*a* illustrates an embodiment of the circuit TrTB 53 for transforming the values $A^{1'}, B^{1'}, \ldots, A^{m'}, B^{m'}$ output by the ternary memory 52 to binary values $x'_1, x'_2, \ldots, x'_n$. Circuit 53 is composed of m partial circuits $R_1$ 711, $R_2$ 712, . . . , $R_m$ 71*m* for transforming the values $A^{1'}, B^{1'}$ to the values $x'_1, x'_2, x'_3$, the values $A^{2'}, B^{2'}$ to the values $x'_4, x'_5, x'_6, \ldots$, the values $A^{m'}, B^{m'}$ to the values $x'_{n-2}, x'_n$. The function implemented by the partial circuit $R_i$ 71*i* is designated with $r_i$.

The values $A^{i'}, B^{i'}$ are analog values which, as explained, are interpreted as ternary values depending on their belonging to the three different intervals $W_0, W_1$, and $W_2$. The function implemented by a partial circuit $R_i$ is designated with $r_i$ for i=1, . . . , m.

Figure 7B:
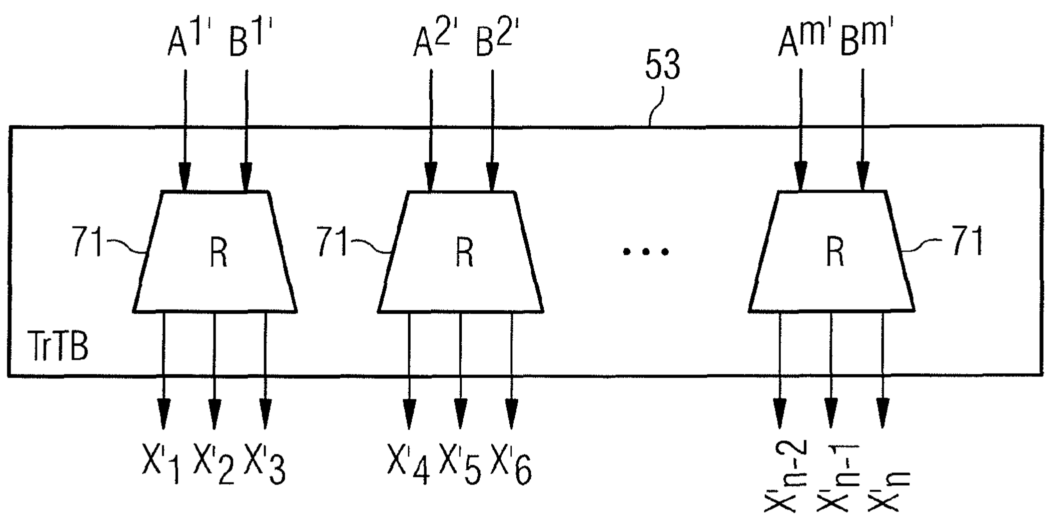

In FIG. 7*b*, all partial circuits $R_1$ 711, $R_2$ 712, . . . $R_m$ 71*m* of FIG. 7*a* were chosen equal to a partial circuit R 71, so that the circuit TrTB 53 is implemented as a parallel circuit of m partial circuits R 71. Each of these partial circuits then implements a function r.

In the following, various embodiments of partial circuits F 61 and R 71 are described.

First of all, the circuit F for implementing the function $f$ is described. The function $f$ is defined by Table 1.

Table 1 illustrates how the tuples A, B of analog values are, in accordance with an embodiment, assigned to the 8 possible triples of binary values 000, 001, . . . , 111 by function $f$. The corresponding binary variables are designated in Table 1 with $x_1, x_2, x_3$, so that Table 1 describes the function $f$ for the first three variables. For the respectively following three variables $[x_4, x_5, x_6]$, $[x_7, x_8, x_y]$, . . . , the same function $f$ is used. Depending on the belonging of the analog values A, B to one of the intervals $W_0, W_1, W_2$, they are designated as ternary values $A_0, A_1, A_2$ or $B_0, B_1, B_2$, respectively. Function $f$ as determined by Table 1 is implemented by circuits F 61 depicted in FIG. 6*b*.

It is generally not necessary that analog values A, B that correspond to the first three binary variables $x_1, x_2, x_3$ are stored in the first two memory cells of the ternary memory 52. Likewise analog values not necessarily correspond to binary variables $x_4, x_5, x_6$, that are stored in the following two memory cells, etc. If analog values A, B, which are determined by the values of the binary variables $x_i, x_j, x_k$, are stored in a pair of memory cells, the binary variables $x_1, x_1, x_k$ are called the variables corresponding to the memory cells in which the analog values A, B are stored.

Thus, if, for example, analog values A, B, that are determined by the binary variables $x_7, x_{11}, x_{21}$, are stored in the second and third memory cells of the ternary memory, the variables $x_7, x_{11}, x_{21}$ are the binary variables corresponding to the second and third memory cells.

In Table 1, the variables $x_1, x_2, x_3$ are the binary variables corresponding to the pair of memory cells storing ternary values A, B.

Table 1 describes a first example of a function $f$ that can be implemented by the partial circuit F 61.

TABLE 1

| $x_1x_2x_3$ | A | B |
|---|---|---|
| 000 | $A_0$ | $B_0$ |
| 001 | $A_1$ | $B_2$ |
| 010 | $A_0$ | $B_1$ |
| 011 | $A_0$ | $B_2$ |
| 100 | $A_2$ | $B_1$ |
| 101 | $A_2$ | $B_0$ |
| 110 | $A_2$ | $B_2$ |
| 111 | $A_1$ | $B_0$ |

For instance, the tuple of ternary values $A_0, B_0$ is assigned by Table 1 or by function $f$ to the triple of binary values 000 (first line of Table 1), and the tuple $A_2, B_1$ to the triple 100 ($5^{th}$ line of Table 1). The analog values A and B of a tuple of analog values A, B are each stored in a memory cell of the ternary memory 52. The values stored in a memory cell are referred to as the conditions of the memory cell.

Since there exist eight different triples of binary values and nine different tuples of ternary values, one of the tuples of ternary values, according to Table 1 the tuple $A_1, B_1$, does not occur. This tuple of ternary values is assigned to none of the triples of binary values.

For any of the triples $x_1, x_2, x_3$ of binary values written into memory Schspei 21, tuple $A_1, B_1$ is not written into the ternary memory 52. If one writes, for instance, the triple 100 into the memory Schspei 21, the tuple of ternary values $A_2, B_1$ is written into the corresponding two memory cells of the ternary memory 52.

Due to an error, however, the tuple $A_2, B_1$ written into the ternary memory 52 may be distorted or falsified to tuple $A_1, B_1$ when the corresponding memory cells are read, so that on reading from the memory instead of the correct tuple $A_2, B_1$ the incorrect tuple $A_1, B_1$ is stored in the corresponding memory cells of the ternary memory 52, and an incorrect value $A_1, B_1$ and hence also an incorrect value $x'_1, x'_2, x'_3$ is read.

Although tuple $A_1, B_1$ is never written into the ternary memory, it is necessary to assign a triple of binary values to this tuple during reading from the memory. In one embodiment, it is of advantage to choose an assignment such that an error correction of the error, which distorted $A_2, B_1$ to $A_1, B_1$, can be performed as easily as possible.

Table 2 describes a function r, illustrating how the corresponding triples $x_1, x_2, x_3$ of binary values may be assigned to tuples $A_1, B_1$. This function r is implemented by partial circuit R 71 of FIG. 7*b*.

TABLE 2

| | $A_0$ | $A_1$ | $A_2$ |
|---|---|---|---|
| $B_0$ | 000 | 111 | 101 |
| $B_1$ | 010 | 000 | 100 |
| $B_2$ | 011 | 001 | 110 |

By means of Table 2 one recognizes which triples of binary values are assigned during reading to the tuples of ternary values that are stored in the memory. The triple of binary values corresponding to $A_i, B_j$ is positioned in the field of intersection of the column designated with $A_i$ and the row designated with $B_j$. Thus, the triple 101 corresponds to the tuple $A_2, B_0$ and the triple 000 corresponds to the tuple $A_1, B_1$. In correspondence with Table 2, the triple 000 (left upper field) is assigned to the tuple $A_0, B_0$, the triple 000 (central field) is assigned to the tuple $A_1, B_1$, and the triple 001 (central field of the lower row) is assigned to the tuple $A_1, B_2$. This assignment is in correspondence with Table 1.

If, by Table 1, the tuple of ternary values $A_0, B_0$ is assigned to the binary triple 000, the triple of binary values 000 is assigned to the tuple of ternary values $A_0, B_0$ by Table 2. In other words: If the triple of binary values 000 is written into the circuit arrangement Schspei 21, it is stored internally in the ternary memory 52 as $A_0, B_0$ in two appropriate memory cells and output during reading as a triple of binary values 000. In general, the mapping of triples of binary values to tuples of ternary values as defined by Table 1 is inverted by the mapping of tuples of ternary values to triples of binary values described in Table 2. Moreover, the triple 000 is assigned to the tuple $A_1, B_1$. For the description of errors in the ternary values or conditions of the memory elements stored in the ternary memory, the term of the contiguous value combination is used. Contiguous value combinations, i.e. tuples of ternary values, are such pairs of value combinations of ternary values that are relatively easy to disturb due to an error into one another.

Two value combinations $A_i, B_j$ and $A_i, B_k$ of ternary values or of conditions of memory cells are called contiguous if k and j differ by 1. Likewise, two value combinations $A_i, B_j$ and $A_i, B_j$ are called contiguous if i and l differ by 1. Thus, the value combinations $A_0, B_1$ and $A_0, B_2$ are contiguous, while the value combinations $A_0, B_1$ and $A_1, B_2$ are not contiguous.

The assignment in Table 1 is implemented such that there applies:

If the value combination $A_i, B_j$ is assigned to $x_1, x_2, x_3$ and the value combination $A_l, B_k$ is assigned to $x'_1, x'_3$, and if $A_i, B_j$ and $A_l, B_k$ are contiguous, then $x_1, x_2, x_3$ and $x'_1, x'_2, x'_3$ differ in an odd number of bits. In other words, the value combinations $x_1, x_2, x_3$ and $x'_1, x'_2, x'_3$ then differ by 1 or 3 bits.

Thus, triples being adjacent in a row or in a column in Table 2 and corresponding to contiguous value combinations of conditions differ by 1 or 3 bits respectively.

Table 1 describes how the 8 triples of binary values $x_1, x_2, x_3$ can be mapped to 8 tuples $A_i, A_j$ of ternary values during writing into the memory. No binary values are mapped to the tuple $A_1, B_1$ during writing. Due to an error in the memory, a tuple of ternary values, for, instance, the tuple $A_2, B_1$ may be distorted to tuple $A_1, B_1$, so that tuple $A_1, B_1$ may occur in the memory although it was not generated intentionally during writing. For reading, the binary value 000 is assigned to the tuple $A_1, B_1$.

By means of Table 2 one also recognizes that it is not possible to assign to all value combinations of pairs of conditions that are contiguous triples of binary values that differ in one bit only. Thus, the value combination $A_1, B_1$ has four neighbors, namely the value combinations $[A_0, B_1]$, $[A_1, B_0]$, $[A_1, B_2]$, and $[A_2, B_1]$. There are, however, only 3 triples, namely $[\overline{x}_1, x_2, x_3]$, $[x_1, \overline{x}_2, x_3]$, $[x_1, x_2, \overline{x}_3]$ that differ from $[x_1, x_2, x_3]$ in one bit. In Table 2, the pairs of triples of binary values 000 and 111 and 111 and 000 which are assigned to the contiguous value combinations $A_0, B_0$ and $A_0, B_1$ or $A_0, B_1$ and $A_1, B_1$, respectively, differ by 3 bits each. Such assignment can be used to enable an implementation of an error correction circuit.

Table 3 describes a further embodiment of an assignment of analog values A, B to the possible eight triples 000, 001, . . . , 111 of binary values which variables $x_1, x_2, x_3$, may take wherein the analog values are again designated as $A_0, A_1, A_2$ or as $B_0, B_1, B_2$, respectively, depending on their belonging to one of the intervals $W_0, W_1, W_2$.

TABLE 3

| $x_1x_2x_3$ | A | B |
|---|---|---|
| 000 | $A_1$ | $B_1$ |
| 001 | $A_2$ | $B_1$ |
| 010 | $A_1$ | $B_0$ |
| 011 | $A_2$ | $B_0$ |
| 100 | $A_0$ | $B_1$ |
| 101 | $A_0$ | $B_2$ |
| 110 | $A_0$ | $B_0$ |
| 111 | $A_1$ | $B_2$ |

By Table 3, tuple $A_1, B_1$ is, for instance, assigned to triple 000 and tuple $A_1, B_2$ is assigned to triple 111. According to table 3 tuple $A_2, B_2$ is assigned to none of the triples, so that this tuple of ternary values can only be stored in the ternary memory 52 if an error has occurred.

Table 4 illustrates an embodiment wherein triples of binary values are assigned to tuples of ternary values.

TABLE 4

| | $A_0$ | $A_1$ | $A_2$ |
|---|---|---|---|
| $B_0$ | 110 | 010 | 011 |
| $B_1$ | 100 | 000 | 001 |
| $B_2$ | 101 | 111 | 000 |

If two tuples of ternary values are contiguous, the triples of binary values assigned to them by Table 4 differ in an odd number of bits, wherein at least one pair of triples of contiguous tuples differs in 3 bits. Thus, binary triple 000, which is assigned to ternary tuple $A_1$, $B_1$, differs from the binary triple 111, that is assigned to the contiguous tuple $A_1$, $B_2$, by three bits.

In the following the advantage that the tuple $A_2$, $B_2$ is assigned to none of the triples of binary values is shown.

In one embodiment ternary memory can be a flash memory. If low threshold voltage values (positive to low negative stored charging values on the floating gate) correspond to ternary values $A_0$ and $B_0$ stored in the memory cells, medium threshold voltage values (low to medium negative stored charging values on the floating gate) correspond to ternary values $A_1$ and $B_1$, and high threshold voltage values (medium to high negative stored charging values on the floating gate) correspond to ternary values $A_2$ and $B_2$, a tuple $A_2$, $B_2$ can only be stored in the memory cells of the ternary memory 52 if, due to an error, a low or medium threshold voltage value was distorted to a higher threshold voltage value. If the ternary memory is a flash memory, the error may, for instance, also have occurred by incorrect programming.

In the case of analog values that have already been written into the ternary memory and that are, for instance, assumed as threshold voltage values here, the analog value, here the threshold voltage value, will increase rarely only, but will rather be diminished incorrectly due to loss of charge. This is due to the fact that the relatively high incorporated electrical fields occur with the higher charging amounts and hence higher threshold voltage values may result in a loss of negative charge. Thus, a stored tuple $A_1$, $B_2$ will only very rarely be distorted incorrectly to the tuple $A_2$, $B_2$ since the charge pertaining to $A_2$ on the floating gate is more negative than that pertaining to $A_1$. The tuple $A_2$, $B_2$ can, however, more easily distort to one of the tuples $A_1$, $B_2$ or $A_2$, $B_1$ by loss of charge.

Tuple $A_2$, $B_2$ is, however, pursuant to the assignment of Table 3, not written into ternary memory 52. So this can only occur in case of a processing error during writing. Accordingly it is of advantage if tuple $A_2$, $B_2$ is not assigned to any triple of binary values, as is illustrated in Table 3.

Table 3 reveals that value $A_1$ is written into a first memory cell of the ternary memory 52 for the allocations 000, 010, and 111. This is exactly the case if the Boolean expression $$T_1=\bar{x}_1\bar{x}_2\bar{x}_3 V \bar{x}_1 x_2 \bar{x}_3 V x_1 x_2 x_3 = \bar{x}_1\bar{x}_3(x_2 V \bar{x}_2) V x_1 x_2 x_3 = \bar{x}_1\bar{x}_3 V x_1 x_2 x_3 \quad (4)$$

equals 1.

Correspondingly, Table 3 reveals that $A_2$ is written into the corresponding memory cell of the ternary memory for the allocations 001 and 011 of $x_1$, $x_2$, $x_3$.

This is the case if the Boolean expression $$T_2=\bar{x}_1\bar{x}_2 x_3 V \bar{x}_1 x_2 x_3 = \bar{x}_1 x_3 \quad (5)$$

equals 1.

For all other allocations of $x_1$, $x_2$, $x_3$ the corresponding memory cell is allocated with $A_0$.

Table 3 also reveals that $B_1$ is written into a corresponding second memory cell of ternary memory 52 for the allocations 000, 001, and 100 of $x_1$, $x_2$, $x_3$.

This is the case if the Boolean expression $$T_3=\bar{x}_1\bar{x}_2\bar{x}_3 V \bar{x}_1\bar{x}_2 x_3 V x_1\bar{x}_2\bar{x}_3 = \bar{x}_2(\bar{x}_1 V \bar{x}_3) \quad (6)$$

equals 1.

Correspondingly, Table 3 reveals that $B_2$ is written into the corresponding memory cell of the ternary memory for the allocations 101 and 111 of $x_1$, $x_2$, $x_3$. This is the case if the Boolean expression $$T_4=x_1\bar{x}_2 x_3 V x_1 x_2 x_3 = x_1 x_3 \quad (7)$$

equals 1. For all other allocations of $x_1$, $x_2$, $x_3$ the corresponding memory cell is allocated with $B_0$.

If the ternary memory 52 is a flash memory, it is well-known that a memory cell in a memory area is only written into after the deletion of the memory area. After deletion, all memory cells of the deleted memory area are set to a value $A_0$ or $B_0$, respectively, so that only the values differing from $A_0$ or from $B_0$, respectively, have to be written.

Figure 8A:
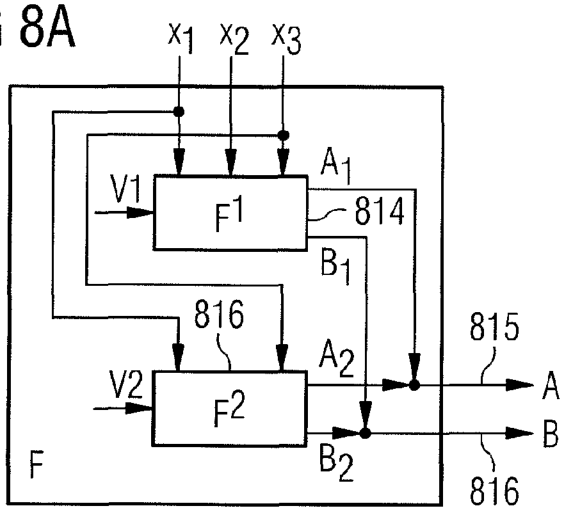
FIGS. 8*a*, 8*b* and 8*c* depict embodiments of implementations of partial circuit F.
Figure 8B:
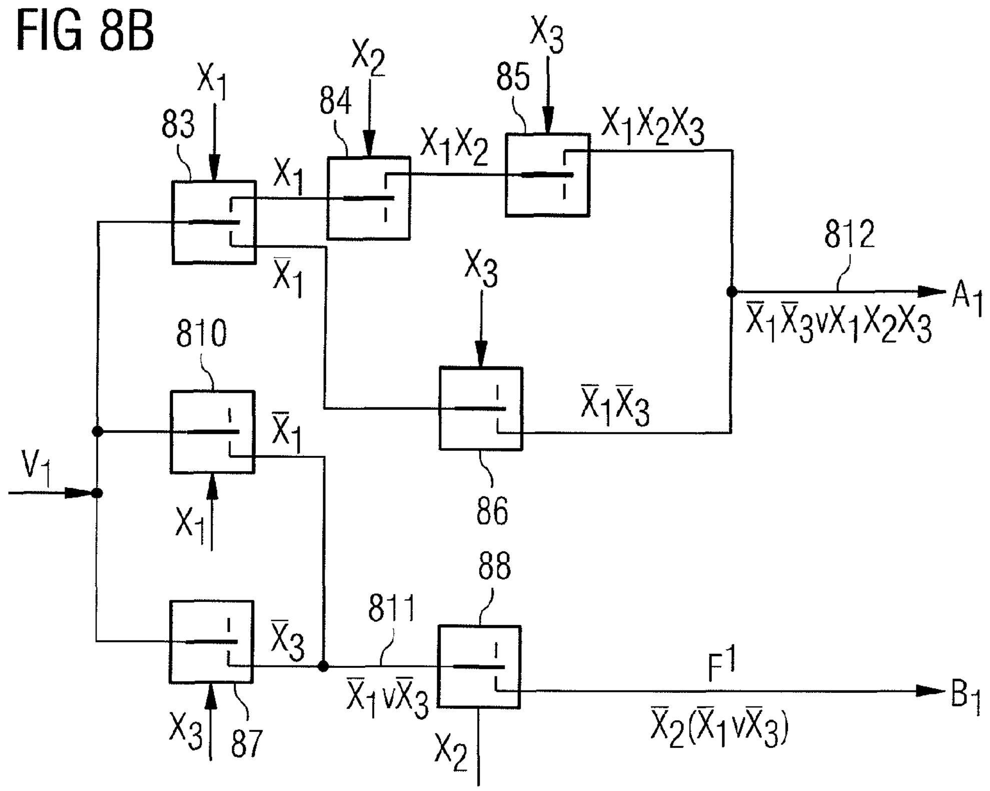
Figure 8C:
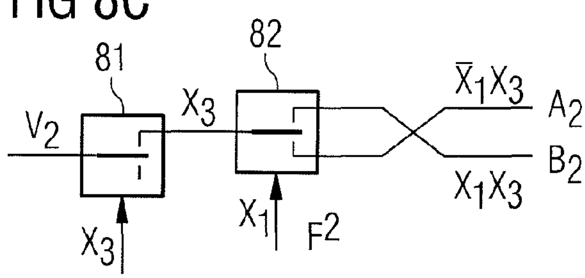

FIGS. 8*a*, 8*b*, 8*c* illustrate an implementation of partial circuit F for implementing function F 61 in FIG. 6*b* by making use of Tables 3 and 4. The binary inputs are again designated with $x_1$, $x_2$, $x_3$ in FIG. 8*a*. The binary inputs $x_1$, $x_2$, $x_3$ are directly mapped to the corresponding analog output values A and B that represent ternary values.

Partial circuit F 61 of FIG. 6*b* for implementing the function $f$ is composed of the two partial circuits $F^1$ 814 and $F^2$ 817, as is illustrated in FIG. 8*a*. Partial circuit F 61 is illustrated in FIG. 8*a* for the first three binary input values $x_1$, $x_2$, $x_3$ and for the first two ternary output values $A_1$ and $B_1$ of the circuit TrBT 51 of FIG. 6*b*.

First partial circuit $F^1$ 814 has three binary inputs at which the binary values $x_1$, $x_2$, $x_3$ are available, and one analog input at which an analog value $V_1$ is constantly available. $V_1$ is an analog value being in the interval $W_1$. The partial circuit $F^1$ 814 has a first analog output at which value $A_1=V_1$ is output if this output is coupled to the analog input that carries the signal $V_1$. It comprises a second analog output at which value $B_1=V_1$ is output if this output is coupled to the analog input carrying analog signal $V_1$.

For the binary allocations $x_1$, $x_2$, $x_3$ for which $T_1=\bar{x}_1 \bar{x}_3 V x_1 x_2 x_3=1$ is valid, the analog input carrying value $V_1$ is coupled to the first output carrying the value $V_1$ then, and for the binary allocations $x_1$, $x_2$, $x_3$ for which $T_3=\bar{x}_2(\bar{x}_1 V \bar{x}_3)=1$ is valid, the analog input carrying value $V_1$ is coupled to the second output that carries the value $V_1$ then.

The second partial circuit $F^2$ 817 exhibits two binary inputs to which the binary values $x_1$, $x_3$ are provided, and one analog input to which an analog value $V_2$ is constantly provided. $V_2$ is an analog value in the interval $W_2$. Partial circuit $F^2$ 817 comprises a first analog output at which value $A_2=V_2$ is output if this output is coupled to the analog input carrying analog signal $V_2$, and a second analog output at which value $B_2=V_2$ is output if this output is coupled to the analog input carrying the analog signal $V_1$.

For binary allocations $x_1$, $x_3$ for which $T_2=\bar{x}_1\bar{x}_3=1$ applies, the analog input carrying value $V_2$ is coupled to the first output carrying value $V_2$ then, and for the binary assignments $x_1$, $x_3$ for which $T_4=\bar{x}_1 x_3=1$ applies, the analog input carrying value $V_2$ is coupled to the second output that carries the value $V_2$ then.

The first output of the partial circuit $F^1$ 814 and the first output of the second partial circuit $F^2$ 817 are coupled to the first output 815 of circuit F 61 marked with A. This output is, depending on the binary allocation $x_1$, $x_2$, $x_3$ available, coupled to the analog input of the partial circuit $F^1$ 814 that carries the value 1/E $W_1$ if $T_1=1$, or, if $T_2=1$, to analog input of the partial circuit $F^2$ 817 carrying the analog value $V_2 \epsilon W_2$, or, if neither $T_1=1$ nor $T_2=1$ applies, to none of these analog inputs. For $T_1=1$ there applies $A=A_1$, and for $T_2=1$ there applies $A=A_2$.

The second output, i.e. B1, of partial circuit $F^1$ 814 and the second output i.e. B2, of the second partial circuit $F^2$ 817 are connected with the second output of the circuit F 61 which is marked with B. This output is, depending on the binary allocation $x_1$, $x_2$, $x_3$ available, coupled to the analog input of the partial circuit $F^1$ 814 carrying value $V_1 \in W_1$ if $T_3=1$, or if $T_4=1$, to the analog input of the partial circuit $F^2$ carrying the analog value $V_2 \in W_2$, or, if neither $T_3=1$ nor $T_4=1$ applies, to none of these analog inputs. For $T_3=1$ there applies $B=B_1$, and for $T_4=1$ there applies $B=B_2$.

Note that in FIG. 6*a*, the analog values constantly carrying the values $V_1$ and $V_2$ are not illustrated as inputs of the circuit F 61.

FIG. 8*b* illustrates an embodiment of an implementation of partial circuit $F^1$ 814 of FIG. 8*a*. Circuit $F^1$ is constructed of the switches 83, 84, 85, 86, 87, 88, and 810, each comprising one input and two outputs that are referred to as lower output and upper output. These switches are controlled by the binary values $x_1$, $x_2$, $x_3$, $x_3$, $x_3$, $x_2$, $x_1$. If the binary control value 1, here $x_1=1$, is input in one of the switches, for instance in switch 83, it couples its input to its upper output. If a binary control value 0 is input, it couples the input to its lower output.

The input of partial circuit $F^1$ 814 which carries the analog value $V_1$ is coupled to the input of the switch 83, to the input of the switch 87 and to the input of the switch 810.

The upper output of the switch 83 is coupled to the input of the switch 84. The upper output of the switch 84 is coupled to the input of the switch 85. The lower output of the switch 83 is connected with the input of the switch 86. The lower output of the switch 810 is connected with the lower output of the switch 87 to the line 811, and the line 811 is guided into the input of the switch 88. The lower output of the switch 88 is the second output of the partial circuit $F^1$ 814 which is marked with B1. The lower output of the switch 86 is connected with the upper output of the switch 85 to a line 812 that forms the first output of the partial circuit $F^1$ 89 which is marked with $A_1$.

The connecting lines between the switches are marked in FIG. 8*b* with Boolean expressions, so that value $V_1$ is available on the respective connecting line if the corresponding Boolean expression equals 1. Thus, the connecting line between the switches 83 and 84 is marked with $x_1$ since the value $V_1$ is available on this line if $x_1=1$ applies. The line 811 that implements the connection of the lower outputs of the switches 810 and 87 is marked with $\bar{x}_1 V \bar{x}_3$ since this expression assumes the value 1 and this line carries the value $V_1$ if either $x_1=0$ or $x_3=0$ is valid. The line coupled to the lower output of the switch 88 is marked with the expression $\bar{x}_2(\bar{x}_1 V \bar{x}_3)$. This line carries the value $V_1$ if $T_1=\bar{x}_2(\bar{x}_1 V \bar{x}_3)$.

FIG. 8*c* illustrates a possible implementation of partial circuit $F^2$ 817 of FIG. 8*a*. It comprises switches 81 and 82 with one input and two outputs that are controlled by the binary values $x_1$ and $x_3$.

The input of the circuit $F^2$ 817 carrying the analog value $V_2$ is coupled to the input of switch 81. The upper output of the switch 81 is coupled to the input of the switch 82. The lower output of switch 82 forms the first output of circuit $F^2$ 817, which is marked with $A_2$, while the upper output of switch 82 forms the second output that is marked with $B_2$. The coupling lines between the switches and the outputs are again marked with Boolean expressions. Thus, the connecting line between switches 81 and 82 is marked with $x_3$ since the value $V_2$ is available on this line if $x_3=1$. Correspondingly, the first output line for $A_2$ is marked with $\bar{x}_1 x_3$ since value $V_2$ is output on this output line if $T_2=\bar{x}_1 x_3=1$. The second output line for $B_2$ is marked with $x_1 x_3$ since the value $V_2$ is available on this line if $T_4=x_1 x_3=1$.

Figure 9:
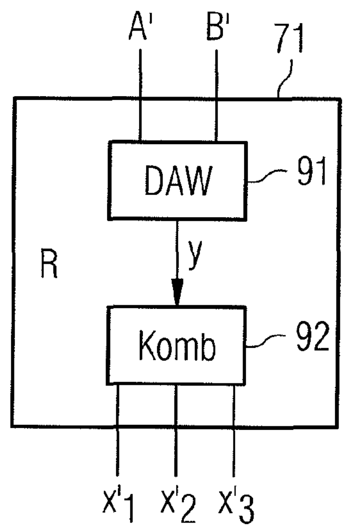
FIG. 9 depicts a partial circuit.

The pertinent partial circuit R 71 of FIG. 7*b* which transforms a tuple of ternary values A'B' which are read out from ternary memory 52 to a corresponding triple $x'_1$, $x'_2$, $x'_3$ of binary values is illustrated in FIG. 9.

The depicted circuit implements the mapping of tuples of ternary values A'B' to triples of binary values $x'_1 x'_2 x'_3$ as illustrated in Table 5 and which results directly from Table 4.

TABLE 5

| A'B' | $x_1x_2x_3$ |
|---|---|
| $A_0B_0$ | 110 |
| $A_0B_1$ | 100 |
| $A_0B_2$ | 101 |
| $A_1B_0$ | 010 |
| $A_1B_1$ | 000 |
| $A_1B_2$ | 111 |
| $A_2B_0$ | 011 |
| $A_2B_1$ | 001 |
| $A_2B_2$ | 000 |

Thus, in the first line of Table 5 the triple 110 is assigned to tuple $A_0B_0$ since the triple 110 is positioned in Table 4 in the left upper field whose column is marked with $A_0$ and whose row is marked with $B_0$. In the last row of Table 4, the triple 000 is assigned to the tuple $A_2B_2$ since the triple 000 is positioned in Table 4 in the right lower field whose column is marked with $A_2$ and whose row is marked with $B_2$.

In one embodiment circuit R 71 of FIG. 9 comprises, for instance, a serial connection of digital-to-analog converter DAW 91 with two analog inputs to which analog values A' and B' are provided, and m binary outputs at which an m-component binary vector $y=y_1, \ldots, y_m$ is output, and a downstream combinational circuit Komb 92 with m binary inputs and 3 binary outputs at which the binary values $x_1x_2x_3$ are output. There applies $m \geq 3$.

The digital-to-analog converter DAW may comprise a digital-to-analog converter converting the analog values A' to two binary values $y_1$, $y_2$ and converting signal B' to two binary signals $y_3$, $y_4$, so that in this case m=4. A person skilled in the art will often perform the digital-to-analog conversion by making use of a Gray code, as is proposed already in Steinbuch, K. and Ruprecht, W. Nachrichtentechnik [Communications Engineering], Publishing House Springer, Berlin, Heidelberg, New York, 1967, pp. 339-341. If $A_0$ and $B_0$ are each converted to 0, 0; $A_1$ and $B_1$ each to 0, 1; and $A_2$ and $B_2$ each to 1, 1 then the value table of the combinational circuit Komb 92 of Table 6 results in that in Table 5 $A_i$ and $B_j$ for j=0, 1, 2 are replaced by the digital tuples $y_1$, $y_2$ and $y_3$, $y_4$ assigned to them.

TABLE 6

| $y_1y_2$, $y_3y_4$ | $x_1x_2x_3$ |
|---|---|
| 00, 00 | 110 |
| 00, 01 | 100 |
| 00, 11 | 101 |
| 01, 00 | 010 |
| 01, 01 | 000 |
| 01, 11 | 111 |
| 11, 00 | 011 |
| 11, 01 | 001 |
| 11, 11 | 000 |

In Table 6, the output values of the combinatory circuit Komb 92 are defined for 9 input values $y_1$, $y_2$, $y_3$, $y_4$.

For the remaining 7 values for $y_1, y_2, y_3, y_4$, which are not listed in Table 6, the output values of the combinatory circuit Komb 92 remain undetermined, and these undetermined or 'don't-care' values may be used for circuit optimization.

The binary values $y_1, y_2, y_3, y_4$ are auxiliary values for reading. They are generated only during reading after the output of analog values $A^{1'}B', \ldots, A^{m'}B^{m'}$ stored in the corresponding memory cells of the ternary memory 52 by means of digitizing by an analog-to-digital converter DAW 91. When writing data into memory Schspei these binary auxiliary values for reading $y_1, y_2, y_3, y_4$ are not required. Various analog-digital converters may be used to generate m binary auxiliary values for reading $y_1, \ldots, y_m$.

Another possibility of digital-to-analog conversion of auxiliary values for reading comprises digitizing each of the analog signals A' and B' by making use of a 1-of-3 code. If $A_0$ and $B_0$ are each converted to 0, 0, 1; $A_1$ and $B_1$ each to 0, 1, 0; and $A_2$ and $B_2$ each to 0, 0, 1, the value table of the combinational circuit Komb 92 of Table 7 results in that in Table 5 $A_i$ and $B_j$ for j=0, 1, 2 are replaced by the digital triples $y_1, y_2, y_3$ and $y_4, y_5, y_6$ assigned to them. In this case, m=6 is valid. For a particular function $f$ as defined by Table 3 and for a corresponding function r as defined by Table 4, there are different possibilities of option for the auxiliary values for reading $y_1, \ldots, y_m$ also with different values for m, and that the auxiliary values for reading $y_1, \ldots, y_m$ are not stored in the ternary memory but have to be generated after reading the ternary values from the ternary memory 52 only.

TABLE 7

| $y_1y_2y_3, y_4y_5y_6$ | $x_1x_2x_3$ |
|---|---|
| 100, 100 | 110 |
| 100, 010 | 100 |
| 100, 001 | 101 |
| 010, 100 | 010 |
| 010, 010 | 000 |
| 010, 001 | 111 |
| 001, 100 | 011 |
| 001, 010 | 001 |
| 001, 001 | 000 |

In Table 7, the output values of the combinatory circuit Komb 92 are determined for 9 input values $y_1y_2y_3, y_4y_5y_6$.

For all 64−7=57 values for $y_1y_2y_3, y_4y_5y_6$, which are not listed in Table 7, the output values of the combinational circuit Komb 92 remain undetermined. These undetermined or 'don't-care' values may be used for circuit optimization.

Since the design of a combinational circuit given as a table of values lies within the knowledge of a skilled artisan. Also the implementation of circuit R 71 as defined by the assignment of a triple $x_1, x_2, x_3$ of digital values to a tuple A', B' of ternary values as in Table 5 lies within the knowledge of the skilled artisan, there is no need to unnecessarily obscure this description with the details of circuit R 71.

Figure 10:
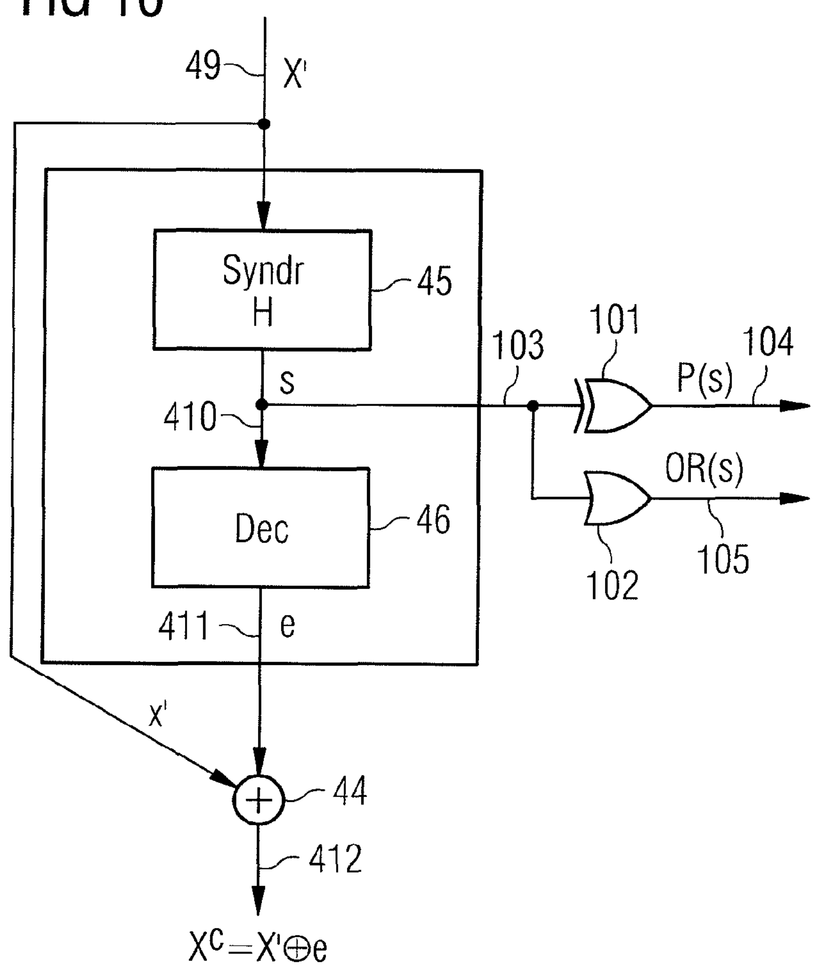
FIG. 10 depicts circuitry for error recognition.

FIG. 10 illustrates an embodiment of circuitry for error detection of 1-bit and 2-bit errors. FIG. 10 first of all illustrates the corrector 43 of FIG. 4. Circuit components corresponding to the circuit components in FIG. 4 are designated with the same reference numbers. In addition to corrector 43 described in FIG. 4, a q-bit line 103 carrying the values of the error syndrome s as output by syndrome generator Syndr 45 is coupled to the input of an XOR circuit 101 with q inputs and one output and an OR circuit 102 with likewise q inputs and one output.

XOR circuit 101 outputs parity value P(s) of the components of the syndrome s with $$P(s)=s_1 \oplus s_2 \oplus \ldots \oplus s_q$$

OR circuit 102 outputs the OR operation of the components of the syndrome s with $$OR(s)=s_1 V s_2 V \ldots V s_q$$

Assuming that only correct values of 1-bit errors, 3-bit errors and 2-bit errors are to be distinguished from one another, there applies:

If P(s)=0 and OR(s)=0, then there is no error.

If P(s)=1 and OR(s)=1, then there is a 1-bit error or a 3-bit error.

If P(s)=0 and OR(s)=1, then there is a 2-bit error.

Subsequently the error correction according to the invention is described with an embodiment comprising q=5 check bits $c=c_1, \ldots, c_5$ and k=7 data bits $u=u_1, \ldots, u_7$, so that the code exhibits a length of n=12 bits. The columns of the H-matrix $h_i$ with i=1, . . . , 12 all exhibit an odd number of ones. The H-matrix is indicated here in systematic form $$H=(I_5, P_{5,7})$$

wherein $I_5$ is the (5, 5) unit matrix and $P_{5,7}$ a (5, 7) is a parity matrix.

The H-matrix H=$h_2, h_{12}$) in one embodiment can be $$H = \begin{pmatrix} 1 & 0 & 0 & 0 & 0 & 1 & 1 & 1 & 0 & 0 & 0 & 1 \\ 0 & 1 & 0 & 0 & 0 & 1 & 1 & 0 & 1 & 1 & 1 & 0 \\ 0 & 0 & 1 & 0 & 0 & 0 & 1 & 1 & 1 & 1 & 0 & 1 \\ 0 & 0 & 0 & 1 & 0 & 1 & 1 & 1 & 1 & 0 & 1 & 0 \\ 0 & 0 & 0 & 0 & 1 & 0 & 1 & 0 & 0 & 1 & 1 & 1 \\ 1 & 2 & 3 & 4 & 5 & 6 & 7 & 8 & 9 & 10 & 11 & 12 \end{pmatrix} \quad (8)$$

Every column $h_i$, i=1, . . . , 12 consists of 5 components, so that the H-matrix consists of 5 rows. Note that for illustration purposes only each column is terminated in the sixth row by an integer number indicating the number of the column.

In the following it is illustrated that there exists a partition of the columns of the H-matrix in w=n/3=12/3=4 sets $M_1=\{h_1, h_2, h_3\}$, $M_2=\{h_4, h_5, h_6\}$, $M_3=\{h_7, h_8, h_9\}$, $M_4=\{h_{10}, h_{11}, h_{12}\}$ with 3 columns each, so that the element-wise XOR sum of the respectively three columns of the H-matrix contained in one of these sets is not a column of the H-matrix. The columns of the H-matrix are arranged such that the first three columns $h_1, h_2, h_3$ of the H-matrix are elements of the first set $M_1$, the following three columns $h_4, h_5, h_6$ are elements of set $M_2$, the following three columns $h_7, h_8, h_9$ are elements of set $M_3$, and the following three columns $h_{10}, h_{11}, h_{12}$ are elements of set $M_4$.

In case the columns are initially arranged in some other way, the columns can be rearranged that every three consecutive columns are elements of one of these sets.

Since n=12 is divisible by 3 without remainder, there are w=12/3=4 such sets without any columns remaining during the classification in sets of three elements. If the remainder of the division of n by 3 is 1, there is another set $M_{m+1}=\{h_n\}$ comprising one element. Since all columns of the H matrix are different, this additional column $H_n$ will not occur again in the H-matrix H. If the remainder of the division of n by 3 is 2, there is another set $M_{w+1}=\{h_{n-1}, h_n\}$. The H-matrix H will then have to be chosen such that the element-wise XOR sum $h_{n-1} \oplus h_n$ does not form a column of the H-matrix.

The element-wise XOR sum of the first three columns $$k_1=h_1 \oplus h_2 \oplus h_3=[1,1,1,0,0]^T$$

does not form a column of the H-matrix. Likewise, there applies: The element-wise XOR sum of the following three columns $$k_4=h_4\oplus h_5\oplus h_6=[1,1,0,0,1]^T$$

does not form a column of the H-matrix. Likewise, there applies: The element-wise XOR sum of the following three columns $$k_7=h_7\oplus h_8\oplus h_9=[0,0,1,1,1]^T$$

does not form a column of the H-matrix. Likewise, there applies: The element-wise XOR sum of the following three columns $$k_{10}=h_{10}\oplus h_{11}\oplus h_{12}=[1,0,0,1,1]^T$$

does not form a column of the H-matrix.

For i=1 mod 3 there applies that the XOR sum $k_i=h_i\oplus h_{i+1}\oplus h_{i+2}$ does not form a column of the H-matrix.

Such H-matrix may, for instance, be determined as follows: In a first step the set of all possible columns that are basically suited as columns of the H-matrix are chosen.

These are, for instance, all different columns with m elements or all columns with m elements having an odd number of ones. In the described embodiment with m=5, all 16 columns with an odd number of ones have been chosen as a set of all basically possible columns. If the H-matrix shall be determined in systematic form, the columns with exactly one 1 are chosen as the first 5 columns from the set of all possible columns. These columns no longer form part of this set now. They form the unit matrix $I_5$ of the H-matrix.

For the first three columns there applies $k_1=h_1\oplus h_2\oplus h_3=[1, 1, 1, 0, 0]^T$ and column $k_1$ is deleted from the set of possible columns. Since $h_4$ and $h_5$ are already determined, from the set of the remaining possible columns, $h_6$ is now chosen as the $6^{th}$ column from the set of the remaining possible columns. IN this embodiment this is the column $h_6=[1, 1, 0, 1, 0]^T$. For the three columns $h_4$, $h_5$, $h_6$ following the third column there applies $k_4=h_4\oplus h_5\oplus h_6=[1, 1, 0, 0, 1]^T$. Therefore, the column $k_4=[1, 1, 0, 0, 1]^T$ is deleted from the set of possible columns of the H-matrix. From the set of the remaining possible columns of the H-matrix, the three columns $h_7$, $h_8$ and $h_9$ are now chosen. There applies $k_7=h_7\oplus h_8\oplus h_9=[0, 0, 1, 1, 1]^T$, and column $k_7=[0, 0, 1, 1, 1]^T$ is deleted from the set of possible columns of the H-matrix. From the set of the remaining possible columns of the H-matrix, the three columns $h_{10}$, $h_{11}$ and $h_{12}$ are now chosen. There applies $k_{10}=h_{10}\oplus h_{11}\oplus h_{12}=[1, 0, 0, 1, 1]^T$, and column $k_{10}=[1, 0, 0, 1, 1]^T$ is deleted from the set of possible columns of the H-matrix, which is now empty.

If, during the determination of the H-matrix, there results a column $k_j=h_j\oplus h_{j+1}\oplus h_{j+2}$ with j=1 modulo 3=1 mod 3, which already exists as a column of the determined columns of the H matrix, one simply has to choose from the set of possible columns of the H-matrix, for instance, instead of the column $h_{j+2}$ another column $h'_{j+2}$ for which this does not apply.

Determining from a set of basically possible columns an H-matrix in which the XOR sums $k_i=h_i\oplus h_{i+1}\oplus h_{i+2}$ for i=1 mod 3 do not form columns of the H-matrix lies within the skills of the artisan.

From the H-matrix, the equations for determining the syndrome $s=s_1, s_2, s_3, s_4, s_5$ result as $$s_1=c_1\oplus u_1\oplus u_2\oplus u_3\oplus u_7$$

$$s_2=c_2\oplus u_1\oplus u_2\oplus u_4\oplus u_5\oplus u_6$$

$$s_3=c_3\oplus u_2\oplus u_3\oplus u_4\oplus u_5\oplus u_7$$

$$s_4=c_4\oplus u_1\oplus u_2\oplus u_3\oplus u_4\oplus u_6$$

$$s_5=c_5\oplus u_2\oplus u_5\oplus u_6\oplus u_7.$$

An implementation of these equations as a syndrome generator by making use of XOR gates with 2 inputs and one output is no problem for a skilled artesian and will therefore not be described here in detail.

The function of the decoder is defined by Table 8.

TABLE 8

| $s_1$ | $s_2$ | $s_3$ | $s_4$ | $s_5$ | $e_1$ | $e_2$ | $e_3$ | $e_4$ | $e_5$ | $e_6$ | $e_7$ | $e_8$ | $e_9$ | $e_{10}$ | $e_{11}$ | $e_{12}$ |
|---|---|---|---|---|---|---|---|---|---|---|---|---|---|---|---|---|
| 0 | 0 | 0 | 0 | 0 | 0 | 0 | 0 | 0 | 0 | 0 | 0 | 0 | 0 | 0 | 0 | 0 |
| 1 | 0 | 0 | 0 | 0 | 1 | 0 | 0 | 0 | 0 | 0 | 0 | 0 | 0 | 0 | 0 | 0 |
| 0 | 1 | 0 | 0 | 0 | 0 | 1 | 0 | 0 | 0 | 0 | 0 | 0 | 0 | 0 | 0 | 0 |
| 0 | 0 | 1 | 0 | 0 | 0 | 0 | 1 | 0 | 0 | 0 | 0 | 0 | 0 | 0 | 0 | 0 |
| 0 | 0 | 0 | 1 | 0 | 0 | 0 | 0 | 1 | 0 | 0 | 0 | 0 | 0 | 0 | 0 | 0 |
| 0 | 0 | 0 | 0 | 1 | 0 | 0 | 0 | 0 | 1 | 0 | 0 | 0 | 0 | 0 | 0 | 0 |
| 1 | 1 | 0 | 1 | 0 | 0 | 0 | 0 | 0 | 0 | 1 | 0 | 0 | 0 | 0 | 0 | 0 |
| 1 | 1 | 1 | 1 | 1 | 0 | 0 | 0 | 0 | 0 | 0 | 1 | 0 | 0 | 0 | 0 | 0 |
| 1 | 0 | 1 | 1 | 0 | 0 | 0 | 0 | 0 | 0 | 0 | 0 | 1 | 0 | 0 | 0 | 0 |
| 0 | 1 | 1 | 1 | 0 | 0 | 0 | 0 | 0 | 0 | 0 | 0 | 0 | 1 | 0 | 0 | 0 |
| 0 | 1 | 1 | 0 | 1 | 0 | 0 | 0 | 0 | 0 | 0 | 0 | 0 | 0 | 1 | 0 | 0 |
| 0 | 1 | 0 | 1 | 1 | 0 | 0 | 0 | 0 | 0 | 0 | 0 | 0 | 0 | 0 | 1 | 0 |
| 1 | 0 | 1 | 0 | 1 | 0 | 0 | 0 | 0 | 0 | 0 | 0 | 0 | 0 | 0 | 0 | 1 |
| 1 | 1 | 1 | 0 | 0 | 1 | 1 | 1 | 0 | 0 | 0 | 0 | 0 | 0 | 0 | 0 | 0 |
| 1 | 1 | 0 | 0 | 1 | 0 | 0 | 0 | 1 | 1 | 1 | 0 | 0 | 0 | 0 | 0 | 0 |
| 0 | 0 | 1 | 1 | 1 | 0 | 0 | 0 | 0 | 0 | 0 | 1 | 1 | 1 | 0 | 0 | 0 |
| 1 | 0 | 0 | 1 | 1 | 0 | 0 | 0 | 0 | 0 | 0 | 0 | 0 | 0 | 1 | 1 | 1 |

Encoder Cod 41, in FIG. 4, is defined by a generator matrix G of the contemplated code. The determination of a G-matrix in systematic form from an H-matrix in systematic form is known to the person skilled in the art, and is, for instance, described in Lin, S. and Costello, D. "Error Control Coding: Fundamentals and Applications" Prentice Hall, Englewood Cliffs, 1983, pages 54-55.

A generator matrix G in systematic form results directly from the H-matrix $$H=(I_q,P_{q,k}) \tag{9}$$

of the code in systematic form to $$G(P_{k,q}^T,I_k) \tag{10}$$

wherein $P_{k,q}^T$ is the transposed (k,q) matrix of the (q,k) matrix $P_{q,k}$ in which the rows of $P_{q,k}$ are the columns of $P_{k,q}^T$.

The G-matrix which in one embodiment can be determined from the H-matrix (8) is $$G=\begin{pmatrix}1&1&0&1&0&1&0&0&0&0&0&0\\1&1&1&1&1&0&1&0&0&0&0&0\\1&0&1&1&0&0&0&1&0&0&0&0\\0&1&1&1&0&0&0&0&1&0&0&0\\0&1&1&0&1&0&0&0&0&1&0&0\\0&1&0&1&1&0&0&0&0&0&1&0\\1&0&1&0&1&0&0&0&0&0&0&1\end{pmatrix}, \quad (11)$$

and encoder Cod 11, 41 determines the code words x by $$x=x_1, \ldots, x_{12}=u\cdot G=(c,u)=(c_1, \ldots, c_5, u_1, \ldots, u_7)$$

For the check bits $c=c_1, c_2, c_3, c_4, c_5$ there applies then $$c_1=u_1\oplus u_2\oplus u_3\oplus u_7$$

$$c_2=u_1\oplus u_2\oplus u_4\oplus u_5\oplus u_6$$

$$c_3=u_2\oplus u_3\oplus u_4\oplus u_5\oplus u_7$$

$$c_4=u_1\oplus u_2\oplus u_3\oplus u_4\oplus u_6$$

$$c_5=u_2\oplus u_5\oplus u_6\oplus u_7.$$

An implementation of an encoder by XOR gates, for instance, with two inputs and one output lies within the knowledge of a person skilled in the art and will therefore not be described in detail here.

The mode of operation of the invention will be described in the following by means of examples. In one embodiment we consider k=7 and n=12. Hence, q=n−k=5. Data bits $u=u_1, \ldots, u_7$=0101111 are, for instance, written into the circuit arrangement according to the invention. The data bits u are available on 7-bit input line 47 in FIG. 4. They are encoded by encoder 41 by applying the G-matrix G of equation (11) to the code word $$x=u\cdot G=c_1,c_2,c_3,c_4,c_5,u_1,u_2,u_3,u_4,u_5,u_6,u_7$$

with $u=u_1, u_2, u_3, u_4, u_5, u_6, u_7$=0, 1, 0, 1, 1, 1, 1 and $$c_1=0\oplus1\oplus0\oplus1=0$$

$$c_2=0\oplus1\oplus1\oplus1\oplus1=0$$

$$c_3=1\oplus0\oplus1\oplus1\oplus1=0$$

$$c_4=0\oplus1\oplus0\oplus1\oplus1=1$$

$$c_5=1\oplus1\oplus1\oplus1=0$$

so that x=000100101111 and the 12 elements, i.e. the bits of x are output by encoder 41 on the 12-bit line 48. These values are provided to the input of circuit arrangement Schspei 42 and are stored under the address a provided on line 413. The binary values available at the input of the circuit arrangement Schspei are transformed to analog values representing ternary values, stored as conditions in 2·m=8 memory cells of m=4 pairs of memory cells. The stored conditions, i.e. the ternary values, are retransformed to binary values when reading the analog values representing the ternary values.

Storing of data will now be explained in more detail by means of FIG. 5. As described, binary sequence x=000 100 101 111 is provided to the input of circuit arrangement Schspei. In FIG. 5, the input 54 corresponds to this input.

By means of circuit TrBT 51 for transforming a sequence of binary values to a sequence of ternary values, binary sequence x is transformed to sequence $A^1B^1$, $A^2B^2$, $A^3B^3$, $A^4B^4$ of ternary values. In one embodiment, i.e. as illustrated in FIG. 6*b*, circuit TrBT is implemented as a parallel circuit of four equal circuits F 61, wherein circuit F 61 implements function *f* defined by Table 3. A triple of three, here consecutive, binary values is transformed by the circuit F to a tuple of ternary values that are stored as conditions in a pair of memory cells.

In the contemplated embodiment, and in correspondence with Table 3 the first triple of binary values 000 is transformed to tuple $A^1B^1=A_1B_1$ of ternary values, the second triple 100 of binary values is transformed to the tuple $A^2B^2=A_0B_1$ of ternary values, the third triple of binary values 101 is transformed to the tuple $A^3B^3=A_0B_2$ of ternary values, and the fourth triple of binary values 111 to the tuple $A^4B^4=A_1B_2$ of ternary values.

Under address a, the ternary values $A_1B_1$ are stored in the first pair of memory cells of the ternary memory 52, the ternary values $A_0B_1$ in the second pair of memory cells of the ternary memory 52, the ternary values $A_0B_2$ in the third pair of memory cells of the ternary memory 52, and the ternary values $A_1B_2$ in the fourth pair of memory cells of the ternary memory 52 as conditions.

To begin with, we first consider the case that no error occurs. There applies then P(s)=0 and OR(s)=0.

Then, during reading from ternary memory 52 at address a, the ternary values $A_1B_1$, $A_9B_1$, $A_0B_2$, $A_1B_2$ are output on the 2·4=8 bit line 58, and they are provided to the input of the circuit TrTB 53.

It is assumed that the circuit TrTB 53, as illustrated in FIG. 7*b*, is implemented as a parallel circuit of m=4 partial circuits R 71, each implementing the function r as defined in Table 5. Thus, the partial circuit R, for instance, transforms the tuple of ternary values $A_1$, $B_1$ corresponding to the fifth row of Table 5 to the triple 000 of binary values. The binary values 000 100 101 111 are then output via line 56 of FIG. 5 which corresponds to the line 48 in FIG. 4. This sequence of binary values is input via the line 49 of FIG. 4 to syndrome generator Syndr 45 and simultaneously in a first input of XOR circuit 44.

Syndrome generator Syndr 45 outputs the error syndrome $s=s_1, s_2, s_3, s_4, s_5$ at its q=n−k=12−7=5 bit output, wherein the elements, i.e. the bits, of the error syndrome s are defined as $$s_1=0\oplus0\oplus1\oplus0\oplus1=0$$

$$s_2=0\oplus0\oplus1\oplus1\oplus1\oplus1=0$$

$$s_3=0\oplus1\oplus0\oplus1\oplus1\oplus1=0$$

$$s_4=1\oplus0\oplus1\oplus0\oplus1\oplus1=0$$

$$s_5=0\oplus1\oplus1\oplus1\oplus1=0$$

Since no error has occurred, the error syndrome equals 0, as expected.

The values of the syndrome, here s=0, 0, 0, 0, 0, are provided to input line 410 of decoder Dec 46. The decoder accordingly outputs, in correspondence with Table 8, the n=12 bit error vector e=0, . . . , 0. The error vector is provided to the second input of the XOR circuit 44 and is connected with x' to form $x^c=x'\oplus0, \ldots, 0$=000 100 101 111. The result is output at output line 412.

Now it is described how the circuit arrangement according to the invention behaves in case of an error in ternary memory 52, i.e. the condition of a memory cell is falsified for whatever reason.

We consider the case where a correct condition $A_1$ is distorted to become condition $A_0$ in the first memory cell. The tuple $A_1B_1$, which is stored in the first two memory cells correctly, is contiguous to the tuple of ternary values $A_0$, $B_1$. Upon readout, the triple 100 of binary values is, in accordance with Table 4, assigned to this incorrect tuple $A_0$, $A_1$, so that the sequence x'=100 100 101 111 is output at output 49 of circuit arrangement Schspei 42. The incorrect sequence x' differs in one bit from the correct sequence x. This sequence is mapped by the syndrome generator Syndr 45 to the error syndrome 1, 0, 0, 0, 0 that is available the line 410 and hence also at the input of decoder Dec 46. The error syndrome is here equal to the first column of the H-matrix H. For the parity P(s) and for OR(s) there applies now $$P(s)=1 \text{ and } OR(s)=1$$

These values are output on lines 104 and 105 in FIG. 10. Decoder Dec 46 outputs at its output 411 in correspondence with the $2^{nd}$ line of Table 8 an error vector e=1, 0, 0, 0, 0, 0, 0, 0, 0, 0, 0, 0 that is connected in the XOR circuit 44 with the sequence x' to $x^c=x'\oplus e=(1, 0, 0, 1, 0, 0, 1, 0, 1, 1, 1, 1)\oplus(1, 0, 0, 0, 0, 0, 0, 0, 0, 0, 0, 0)=(0, 0, 0, 1, 0, 0, 1, 0, 1, 1, 1, 1)=x$, so the error distorting $A_1$ to $A_0$ and resulting in an error in the binary sequence x' is corrected properly.

In another example, the case is considered that condition $B_2$ of the $8^{th}$ memory cell is distorted to $B_1$. The tuple of ternary values $A_1B_1$ stored in the 7th and 8th memory cells of ternary memory 52 is contiguous to the corresponding correct tuple $A_1B_2$. The triple of binary values 000 is assigned according to table 4 to the incorrect tuple $A_1$, $B_1$, so this error results in the change of three consecutive bits of the binary sequence x'. For the parity P(s) and for OR(s) there applies now $$P(s)=1 \text{ and } OR(s)=1$$

These values are output via lines 104 and 105 in FIG. 10. An error distorting a tuple of ternary values to a tuple of contiguous ternary values is detected from the fact that P(s)=1 and =OR(s)=1.

At output 49 of circuit arrangement 42, the bit sequence x'=000100101000 is now output, from which the error syndrome $s=s_1, s_2, s_3, s_4, s_5=1, 00, 1, 1$ is derived which equals the XOR sum of the last three columns of the H-matrix H. This error syndrome does not form a column of the H-matrix H.

By means of decoder 46, the error vector e=0, 0, 0, 0, 0, 0, 0, 0, 0, 1, 1, 1 is, in accordance with the last line of Table 8, assigned to this syndrome, said error vector being XORed in the XOR circuit element-wise with x'=0, 0, 0, 1, 0, 0, 1, 0, 1, 0, 0, 0 to $x^c=x'\oplus e=x$, so this error is detected and corrected properly.

An error, that distorts two tuples of ternary values to two respectively contiguous tuples of ternary values results in P(s)=0 and OR(s)=1, which are output on lines 104 and 105 in FIG. 10.

Now, there will be explained for one embodiment how the pertinent tuple of ternary values can be determined directly from a triple of binary values.

A triple 111 of binary values is directly mapped to the tuple of ternary values $A_1B_2$ in correspondence with the last line of Table 3. The triple of binary values is described by variables $x_1$, $x_2$, $x_3$, irrespective of the fact for which pair of memory cells the tuple of ternary values is determined.

We first consider circuit of FIG. 8*b*, which implements the circuit $F^1$ 814 of FIG. 8*a*. Although in the instant case it is a matter of the $7^{th}$ and $8^{th}$ memory cells, the corresponding binary variables are, as mentioned, designated with $x_1$, $x_2$, $x_3$, so that $x_1=1$, $x_2=1$, and $x_3=1$ applies. Switches 83, 84, and 85 each connect their input with their upper output, so that the input carrying the analog value $V_1$ is directly connected with the output 812 and $A_1$=Since $V_1$ belongs to the interval $W_1$, $A_1\epsilon W_1$ correctly applies. The switches 86, 87, 88, and 810 also connect their input with their upper output, so that no further connection of the input carrying the value $V_1$ exists with an output.

Now, the circuit of FIG. 8*c* which implements the circuit $F^2$ of FIG. 8*a* will be considered. Since $x_1=x_3=1$, the switches 81 and 82 each connect their input with their upper output, so that $B_2=V_2$ and $B_2\epsilon W_2$ applies, since $V_2\epsilon W_2$. As illustrated in FIG. 8*a*, the output of circuit $F^1$, which is marked with $A_1$, and the output of circuit $F^2$, which is marked with $A_2$, are coupled to line 815 carrying value $A=A_1\epsilon W_1$, since this output is only coupled to the input of circuit $F^1$ carrying the analog signal $V_1$. The output of circuit $F^1$, which is marked with $B_1$, and the output of circuit $F^2$, which is marked with $B_2$, are coupled to line 816 carrying value $B=B_2\epsilon W_2$, since this output for $x_1=x_3=1$ is only coupled to the input of circuit $F^2$ which carries the analog signal $V_2$.

The invention claimed is:

1. A memory device for storing a block of binary data u of length k, k being an integer, k>2, comprising:

an encoder configured to receive the binary data, and configured to encode the block of binary data u of length k into encoded binary data x of length n, n≥k, wherein the encoder uses an error correcting code C with a code distance d≥3; and a storage component coupled to the encoder, and configured to receive the encoded binary data x and output binary output data x' of length n, wherein the storage component is configured to transform binary data x into ternary data, store the ternary data as ternary states in ternary memory cells of a ternary memory, and transform the ternary data into binary data x' when the ternary data is retrieved from the ternary memory; and a corrector coupled to the storage component, the corrector configured to receive binary data x' from the storage component, and correct errors in the received binary data x' caused by errors in the states of the ternary memory cells of the ternary memory.

2. The memory device of claim 1, wherein the error correcting code C is a linear block code with an (k−n) generator matrix G and a (q,n) parity check matrix H with q=n−k.

3. The memory device of claim 2, wherein the corrector comprises a syndrome generator, a decoder, and a combiner circuit, wherein the syndrome generator is configured to generate an error syndrome $s=s_1, \ldots, s_q$ of length q with q=n−k based on the received binary data $x=x_1', \ldots, x_n'$ wherein $$s^T=H\cdot(x_1', \ldots, x_n')^T$$

and wherein $s^T$ is a column vector of length q of the elements $s_1, \ldots, s_q$ and $(x_1', \ldots, x_n')^T$ is the column vector of length n of the elements wherein $H=(h_1, h_2, \ldots, h_n)$ is the parity check matrix of code C with the column vectors $h_1, \ldots, h_n$, wherein the column vectors are pairwise different where the columns $h_1, h_2, \ldots, h_n$ of the H-matrix H consist of n/3 groups of three columns $\{h_{i1}, h_{i2}, h_{i3}\}, \ldots, \{h_{i[n-2]}, h_{i[n-1]}, h_{in}\}$ if n is divisible by 3 without remainder, and wherein the columns $h_1, h_2, \ldots, h_n$ of the H-matrix H consist of (n−2)/3 groups of three columns each $\{h_{i1}, h_{i2}, h_{i3}\}, \ldots, \{h_{i[n-4]}, h_{i[n-3]}, h_{i[n-2]}\}$ and a group of two columns $\{h_{i[n-1]}, h_{in}\}$ if n−2 is divisible by 3 without remainder, and wherein the columns $h_1, h_2, \ldots, h_n$ of the H-matrix H consist of (n−1)/3 groups of three columns each $\{h_{i1}, h_{i2}, h_{i3}\}, \ldots, \{h_{i[n-3]}, h_{i[n-2]}, h_{i[n-1]}\}$ and a group of a single element $\{h_{in}\}$ if (n−1) is divisible by 3 without remainder, such that the component-wise XOR sum of all columns of each group of columns of the parity check matrix H do not form a column of the parity check matrix H if the corresponding group contains at least two columns.

4. The memory device of claim 3, wherein binary data bits corresponding to the columns of a group of columns of the H-matrix, for which the componentwise XOR-sum of that columns does not form a column of the H-matrix, are stored as ternary values in a pair of memory cells of the memory device.

5. The memory device of claim 1, wherein information is stored in a ternary memory cell as a continuous physical value or state Z of that memory cell which, in dependence on the membership of the state Z of that memory cell to one of non-overlapping intervals $W_0$, $W_1$, $W_2$ of the continuous physical values, represents a ternary value $Z_0$, $Z_1$ or $Z_2$ with $Z_0<Z_1<Z_2$, where $Z_2$ is maximal and where $Z_0$ is minimal.

6. The memory device of claim 5, wherein Z represents a threshold voltage of a nonvolatile memory cell.

7. The memory device of claim 1, wherein in the storage component a pair of ternary memory cells is provided for storing one triple of binary data.

8. The memory device of claim 7, wherein the storage component comprises circuitry configured to transform a triple of binary data into a tuple of ternary data, wherein the circuitry exhibits at least three binary inputs and two ternary outputs, and wherein the circuitry for a triple of binary data $x_1,x_2,x_3$ outputs a tuple ternary values $Z^1,Z^2$, and for another, different triple of binary data $x_1',x_2',x_3'$ the circuitry outputs another, different pair of ternary values $Z^{1'},Z^{2'}$, wherein $Z^1$, $Z^2$ and $Z^1$, $Z^2$ belong to different pairs of ternary values $W_i,W_j$ and $W_k,W_l$, with $(W_i,W_j)\neq(W_k,W_l)$, and wherein if the pairs of ternary values are neighbouring, then $x_1,x_2,x_3$ and $x_1',x_2',x_3'$ differ by one or by three bits, whereby the pairs $Z^1,Z^2$ and $Z^{1'},Z^{2'}$ are neighboring if a first of their components belongs to the same interval and the second component belong to two contiguous intervals $W_K$ and $W_L$ of physical values where K and L differ by 1.

9. The memory device of claim 8, wherein the circuitry for transforming a triple of binary data to a tuple of ternary data is configured to transform none of the triples 000, 001, 010, 011, 100, 101, 110, 111 of binary values into a tuple of ternary data $Z_i$, $Z_i$, wherein $Z_i$ corresponds to a minimal physical value stored in a ternary memory cell.

10. The memory device of claim 8, wherein the circuitry for transforming a triple of binary data to a tuple of ternary data is configured to transform none of the triples 000, 001, 010, 011, 100, 101, 110, 111 of binary values into a tuple of ternary data $Z_i$, $Z_i$, wherein $Z_i$ corresponds to a maximal physical value stored in a ternary memory cell.

11. The memory device of claim 10, wherein the columns of the parity check matrix $H=(h_1, \ldots, h_n)$ are ordered such that $h_1, \ldots, h_n=h_{i1}, \ldots, h_{in}$.

12. The memory device of claim 11, wherein the columns $h_1, \ldots, h_n$ of the parity check matrix H comprises an odd number of ones.

13. The memory device of claim 12, wherein the device outputs an error signal indicating a 2-bit error if the syndrome s does not equal 0 and if the number of ones of components of the syndrome is even and indicating a 1-bit error or a 3-bit error if the number of ones of the components of the syndrome is odd.

14. A memory device for storing binary data, comprising:

an encoder configured to receive a block of binary data u of length k, k>2, and encode the received binary data using a linear error correcting code thus producing a block of encoded binary data x of length n, n>k;

a storage component, coupled to the encoder and comprising binary-to-ternary transformer circuitry configured to transform triples of encoded binary data x into tuples of ternary signals, and further comprising ternary memory configured to store the ternary signals, and comprising ternary-to-binary transformer circuitry configured to transform tuples of ternary signals into triples of binary signals x', and wherein the storage component is configured to output binary signals x'; and corrector circuitry coupled to the output of the storage component, and configured to determine an error vector e based on the output binary signals x' of the storage component; and a circuit coupled to the output of the storage component and to the output of the corrector circuitry, and configured to combine the binary signals x' and error vector e to produce a corrected output of the memory device.

15. The memory device of claim 14, wherein the corrector circuitry comprises:

a syndrome generator configured to generate an error syndrome s of length q=n−k based on a parity check matrix and the output of the storage means x'; and a decoder circuit configured to generate the error vector e of length n based on the error syndrome s.

16. The memory device of claim 15, wherein the circuit coupled to the output of the storage component and the output of the corrector circuitry is configured to XOR-combine the error vector e with the binary signals x' to correct the data as output by the storage component.

17. The memory device of claim 16, wherein in the storage component two ternary memory cells are provided for storing triples of binary data and where the storage component comprises circuitry configured to transform a tuple of ternary data into a triple of binary data, the circuitry exhibiting two ternary inputs and three binary outputs, wherein the circuitry for a tuple of ternary data $Z^1$, $Z^2$ outputs a triple of binary data $x_1,x_2,x_3$, and if for another, different tuple $Z^{1'}$, $Z^{2'}$ of ternary data the circuitry outputs a triple $x_1',x_2',x_3'$, of binary data, wherein $Z^1$, $Z^2$ and $Z^{1'}$, $Z^{2'}$ belong to different pairs of intervals $W_i,W_j$ and $W_k,W_l$ with $(W_i,W_j)\neq(W_k,W_l)$ and wherein the pairs of ternary states are neighboring, then $x_1,x_2,x_3$ and $x_1',x_2',x_3'$ differ by one or three bits, whereby the pairs $Z^1$, $Z^2$ and $Z^{1'}$, $Z^{2'}$ are neighboring if a first component of the first pair and a first component of the second pair belong to the same interval and the second component of the first pair and the second component of the second pair belong to different intervals $W_K$ and $W_L$ where K and L differ by one.

18. The memory device of claim 17, wherein the decoder is configured to generate an error or correction vector $e=e_1, \ldots, e_n$ with binary components $e_1, \ldots, e_n$ and with $e_i=1$ and $e_j=0$ for $j\neq t$, if the error syndrome s is $s=h_i$, where $h_i$ is the t-th column of the parity check matrix H of the code C and, if n is divisible by 3 without remainder and if $i\in\{1, 4, \ldots, n-2\}$ and if the error syndrome s is $s=h_i\oplus h_{i+1}\oplus h_{i+2} \ldots$, where $h_i$, $h_{i+1}$ and $h_{i+2}$ are the i-th, the (i+1)-th and the (i+2)-th columns of the parity check matrix H of the code C, then the components $e_i$, $e_{i+1}$, $e_{i+2}$ of the error vector e are equal to one and all the other components of the error vector e are equal to zero;

if the remainder of the division of n by 3 is equal to 2 and if $i\in\{1, 4, \ldots, n-4\}$ and if the error syndrome s is $s=h_i\oplus h_{i+1}\oplus h_{i+2}$ then the components $e_i$, $e_{i+1}$, $e_{i+2}$ of the error vector e are equal to one and all the other components of the error vector e are equal to zero;

if the remainder of the division of n by 3 is equal to 2 and if the error syndrome s is $s=h_{n-1}\oplus h_n$, then the components $e_{n-1}$ and $e_n$ of the error vector e are equal to one and all the other components of the error vector e are equal to zero;

if the remainder of the division of n by 3 is equal to 1 and if $i\in\{1, 4, \ldots, n-3\}$ and if the error syndrome s is $s=h_i\oplus h_{i+1}\oplus h_{i+2}$ then the components $e_i$, $e_{i+1}$, $e_{i+2}$ of the error vector e are equal to one and all the other components of the error vector e are equal to zero; and if the remainder of the division of n by 3 is equal to 1 and if the error syndrome s is $s=h_n$, then the component $e_n$ of the error vector e is equal to 1 and all the other components of the error vector are equal to zero, wherein the components $e_1, \ldots, e_n$ of the error vector are component-wise XORed with the corresponding components $x_1', \ldots, x_n'$ of the binary data $x'=x_1', \ldots, x_n'$.

19. A method for storing a block of binary data u of length k, k being integer, k>2, comprising:

receiving the binary data in an encoder, and encoding the block u into e encoded binary data x of length n, n≥k, using an error correcting code C with a code distance code d≥3; and storing the encoded binary data x in a storage component coupled to the encoder, wherein the storing comprises transforming binary data x into ternary data and storing the ternary data as ternary states in ternary memory cells, and reading the ternary data from the ternary memory cells, and transforming the ternary data into binary data x'; and correcting errors in the binary data x' caused by errors in the states of the ternary memory cells.

20. The method of claim 19, wherein the error correcting code C is a linear block code with an (k−n) generator matrix G and a (q,n) parity check matrix H with q=n−k.

21. The method of claim 19, wherein information is stored in a memory cell as a continuous physical value or state Z of that memory cell which, in dependence on the membership of the state Z of that memory cell to one of non-overlapping intervals $W_0$, $W_1$, $W_2$ of the continuous physical values, represents a ternary value $Z_0$, $Z_1$ or $Z_2$ with $Z_0<Z_1<Z_2$, where $Z_2$ is maximal and where $Z_0$ is minimal.

* * * * *

UNITED STATES PATENT AND TRADEMARK OFFICE

CERTIFICATE OF CORRECTION

PATENT NO. : 8,732,560 B2
APPLICATION NO. : 13/466400
DATED : May 20, 2014
INVENTOR(S) : Thomas Kern et al.

It is certified that error appears in the above-identified patent and that said Letters Patent is hereby corrected as shown below:

In the Claims

Column 20, Claim 3, Line 51 Please replace "...length *n* of the elements wherein..." with --... length *n* of the elements $x'_1, \ldots, x'_n$ , wherein--

Signed and Sealed this
Fifteenth Day of July, 2014

Michelle K. Lee
*Deputy Director of the United States Patent and Trademark Office*

UNITED STATES PATENT AND TRADEMARK OFFICE

CERTIFICATE OF CORRECTION

PATENT NO. : 8,732,560 B2
APPLICATION NO. : 13/466400
DATED : May 20, 2014
INVENTOR(S) : Thomas Kern et al.

It is certified that error appears in the above-identified patent and that said Letters Patent is hereby corrected as shown below:

On the Title Page Item (75) Please Correct Inventor 2's name from "Michael Goessei" to --Michael Goessel--

Signed and Sealed this
Ninth Day of September, 2014

Michelle K. Lee
*Deputy Director of the United States Patent and Trademark Office*